(12) United States Patent
Horioka et al.

(10) Patent No.: US 7,316,199 B2
(45) Date of Patent: Jan. 8, 2008

(54) METHOD AND APPARATUS FOR CONTROLLING THE MAGNETIC FIELD INTENSITY IN A PLASMA ENHANCED SEMICONDUCTOR WAFER PROCESSING CHAMBER

(75) Inventors: Keiji Horioka, Chiba (JP); Chun Yan, San Jose, CA (US); Taeho Shin, San Jose, CA (US); Roger Alan Lindley, Santa Clara, CA (US); Qi Li, San Jose, CA (US); Panyin Hughes, Gaithersburg, MD (US); Douglas H. Burns, Saratoga, CA (US); Evans Y. Lee, Milpitas, CA (US); Bryan Y. Pu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 111 days.

(21) Appl. No.: 10/146,443

(22) Filed: May 14, 2002

(65) Prior Publication Data

US 2003/0085000 A1 May 8, 2003

(30) Foreign Application Priority Data

Jul. 6, 2001 (JP) ............... 2001-206905
Oct. 31, 2001 (JP) ............... 2001-335364

(51) Int. Cl.
*C23C 16/00* (2006.01)
*H01L 21/306* (2006.01)

(52) U.S. Cl. ............... 118/723 R; 118/723 MR; 118/723 MA; 118/723 I; 118/723 E; 156/345.42; 156/345.46; 156/345.49; 315/111.41

(58) Field of Classification Search ............ 118/723 R, 118/723 MA, 723 MR, 723 I, 723 IR, 723 AN, 118/723 E; 156/345.1, 345.42, 345.46, 345.49; 315/111.41
See application file for complete search history.

(56) References Cited

U.S. PATENT DOCUMENTS

| | | | |
|---|---|---|---|
| 4,526,643 A | 7/1985 | Okano | |
| 4,552,639 A | 11/1985 | Garrett | |
| 4,600,492 A | 7/1986 | Ooshio | |
| 4,631,106 A | 12/1986 | Nakazato | |
| 4,668,338 A | 5/1987 | Maydan | |
| 4,668,365 A | 5/1987 | Foster | |
| 4,740,268 A | 4/1988 | Bukhman | |
| 4,826,585 A * | 5/1989 | Davis | 204/298.37 |

(Continued)

FOREIGN PATENT DOCUMENTS

EP 0852389 7/1996

*Primary Examiner*—Luz Alejandro-Mulero
(74) *Attorney, Agent, or Firm*—Moser IP Law Group

(57) ABSTRACT

A magnetic field generator for producing a magnetic field that accelerates plasma formation is placed proximate a reaction chamber of semiconductor substrate processing system. The magnetic field generator has four main magnetic coil sections for producing a magnetic field nearly parallel to the top surface of a support pedestal in the reaction chamber and four sub-magnetic coil sections placed generally coaxially with the main magnetic coil sections to produce a magnetic field of the direction opposite of that of the magnetic field produced with the main magnetic coil sections. In the magnetic field generator, magnetic fields of opposite polarities are superimposed on each other when electric currents of opposite directions are applied to the main and sub-magnetic coil sections.

11 Claims, 37 Drawing Sheets

U.S. PATENT DOCUMENTS

| | | | |
|---|---|---|---|
| 4,829,215 A | 5/1989 | Kim | |
| 4,842,683 A | 6/1989 | Cheng | |
| 4,919,783 A | 4/1990 | Asamaki | |
| 4,950,956 A | 8/1990 | Asamaki | |
| 4,963,242 A | 10/1990 | Sato et al. | 204/298.31 |
| 5,032,202 A | 7/1991 | Tsai | |
| 5,061,838 A | 10/1991 | Lane | |
| 5,079,481 A | 1/1992 | Moslehi | |
| 5,081,398 A | 1/1992 | Asmussen | |
| 5,087,857 A | 2/1992 | Ahn | |
| 5,122,251 A | 6/1992 | Campbell | |
| 5,147,520 A * | 9/1992 | Bobbio | 204/192.33 |
| 5,208,512 A | 5/1993 | Forster | |
| 5,211,825 A | 5/1993 | Saito | |
| 5,215,619 A * | 6/1993 | Cheng et al. | 156/345.42 |
| 5,225,024 A | 7/1993 | Hanley et al. | 156/345 |
| 5,252,194 A | 10/1993 | Demaray | |
| 5,304,279 A | 4/1994 | Coultas | |
| 5,308,417 A | 5/1994 | Groechel | |
| 5,444,207 A | 8/1995 | Sekine et al. | 219/121.43 |
| 5,449,977 A | 9/1995 | Nakagawa et al. | 315/111.51 |
| 5,519,373 A | 5/1996 | Miyata | |
| 5,534,108 A | 7/1996 | Qian et al. | 156/643.1 |
| 5,659,276 A | 8/1997 | Miyata | |
| 5,674,321 A | 10/1997 | Pu et al. | 118/723 MR |
| 5,717,294 A * | 2/1998 | Sakai et al. | 315/111.41 |
| 5,718,795 A | 2/1998 | Plavidal | |
| 5,783,102 A | 7/1998 | Keller | |
| 5,798,029 A | 8/1998 | Morita | |
| 5,855,725 A | 1/1999 | Sakai | |
| 5,876,576 A | 3/1999 | Fu | |
| 5,902,461 A | 5/1999 | Xu | |
| 5,907,220 A | 5/1999 | Tepman | |
| 5,945,008 A | 8/1999 | Kisakibaru | |
| 6,014,943 A | 1/2000 | Arami | |
| 6,015,476 A * | 1/2000 | Schlueter et al. | 156/345.46 |
| 6,030,486 A | 2/2000 | Loewenhardt | |
| 6,051,151 A | 4/2000 | Keller | |
| 6,063,236 A | 5/2000 | Sakai | |
| 6,082,293 A * | 7/2000 | Kawashima | 118/723 E |
| 6,085,688 A | 7/2000 | Lymberopoulos | |
| 6,099,687 A * | 8/2000 | Yamazaki | 156/345.46 |
| 6,113,731 A | 9/2000 | Shan et al. | 156/345 |
| 6,143,140 A | 11/2000 | Wang | |
| 6,164,240 A | 12/2000 | Nikulin | |
| 6,190,495 B1 | 2/2001 | Kubota | |
| 6,228,235 B1 | 5/2001 | Tepman | |
| 6,247,425 B1 | 6/2001 | Lymberopoulos | |
| 6,251,242 B1 | 6/2001 | Fu | |
| 6,255,220 B1 | 7/2001 | Kisakibaru | |
| 6,274,008 B1 | 8/2001 | Gopalraja | |
| 6,277,249 B1 | 8/2001 | Gopalraja | |
| 6,296,747 B1 | 10/2001 | Tanaka | |
| 6,300,227 B1 | 10/2001 | Liu | |
| 6,376,388 B1 | 4/2002 | Hashimoto | |
| 6,382,129 B1 | 5/2002 | Nikulin | |
| 6,436,230 B1 | 8/2002 | Kondo | |
| 6,444,104 B2 | 9/2002 | Gopalraja | |
| 6,451,177 B1 | 9/2002 | Gopalraja | |
| 6,485,617 B2 | 11/2002 | Fu | |
| 6,485,618 B2 | 11/2002 | Gopalraja | |
| 6,488,807 B1 | 12/2002 | Collins | |
| 6,491,801 B1 | 12/2002 | Gung | |
| 6,495,009 B1 | 12/2002 | Gung | |
| 6,521,082 B1 | 2/2003 | Barnes | |
| 6,528,751 B1 | 3/2003 | Hoffman | |
| 6,545,580 B2 | 4/2003 | Hegde | |
| 6,579,421 B1 | 6/2003 | Fu | |
| 6,599,399 B2 | 7/2003 | Xu | |
| 6,610,184 B2 | 8/2003 | Ding | |
| 6,613,689 B2 | 9/2003 | Liu | |
| 6,627,050 B2 | 9/2003 | Miller | |
| 6,663,754 B2 | 12/2003 | Gung | |
| 6,673,199 B1 | 1/2004 | Yamartino | |
| 6,716,302 B2 | 4/2004 | Carducci | |
| 6,761,804 B2 | 7/2004 | Perrin | |
| 6,764,575 B1 | 7/2004 | Yamasaki | |
| 6,787,006 B2 | 9/2004 | Gopalraja | |
| 6,797,639 B2 | 9/2004 | Carducci | |
| 6,805,770 B1 | 10/2004 | Oster | |
| 2005/0167051 A1 | 8/2005 | Hoffman | |

* cited by examiner

FIG. 18(a)

| $Z_0$ (mm) | $X_0$ (mm) | | | |
|---|---|---|---|---|
| | 200 | 210 | 220 | 230 |
| 75 | 0.49 | 0.59 | 0.69 | 0.83 |
| 85 | 0.51 | 0.6 | 0.71 | 0.83 |
| 95 | 0.53 | 0.64 | 0.74 | 0.85 |
| 105 | 0.6 | 0.68 | 0.78 | 0.89 |

FIG. 18(b)

| $Z_0$ (mm) | $X_0$ (mm) | | | |
|---|---|---|---|---|
| | 200 | 210 | 220 | 230 |
| 75 | 3.7% | 3.6% | 3.5% | 3.3% |
| 85 | 3.0% | 2.9% | 2.9% | 2.8% |
| 95 | 3.0% | 2.3% | 2.2% | 2.3% |
| 105 | 1.7% | 1.6% | 1.6% | 1.8% |

FIG. 18(c)

| $Z_0$ (mm) | $X_0$ (mm) | | | |
|---|---|---|---|---|
| | 200 | 210 | 220 | 230 |
| 75 | 0.55 | 0.52 | 0.49 | 0.45 |
| 85 | 0.49 | 0.46 | 0.43 | 0.40 |
| 95 | 0.44 | 0.39 | 0.36 | 0.34 |
| 105 | 0.33 | 0.32 | 0.29 | 0.27 |

FIG. 23(a)

| $Z_0$ (mm) | $X_1$ (mm) | | | |
|---|---|---|---|---|
| | 170 | 180 | 190 | 200 |
| 75 | 0.69 | 0.82 | 0.94 | 1.08 |
| 85 | 0.64 | 0.75 | 0.87 | 0.99 |
| 95 | 0.59 | 0.7 | 0.81 | 0.92 |
| 105 | 0.55 | 0.65 | 0.75 | 0.87 |

FIG. 23(b)

| $Z_0$ (mm) | $X_1$ (mm) | | | |
|---|---|---|---|---|
| | 170 | 180 | 190 | 200 |
| 75 | 11.1% | 9.7% | 8.9% | 7.2% |
| 85 | 11.7% | 10.2% | 8.8% | 7.4% |
| 95 | 12.4% | 10.9% | 9.4% | 7.8% |
| 105 | 13.4% | 11.7% | 10.2% | 8.5% |

FIG. 23(c)

| $Z_0$ (mm) | $X_1$ (mm) | | | |
|---|---|---|---|---|
| | 170 | 180 | 190 | 200 |
| 75 | 0.47 | 0.39 | 0.34 | 0.28 |
| 85 | 0.45 | 0.38 | 0.32 | 0.26 |
| 95 | 0.44 | 0.36 | 0.30 | 0.24 |
| 105 | 0.42 | 0.35 | 0.29 | 0.22 |

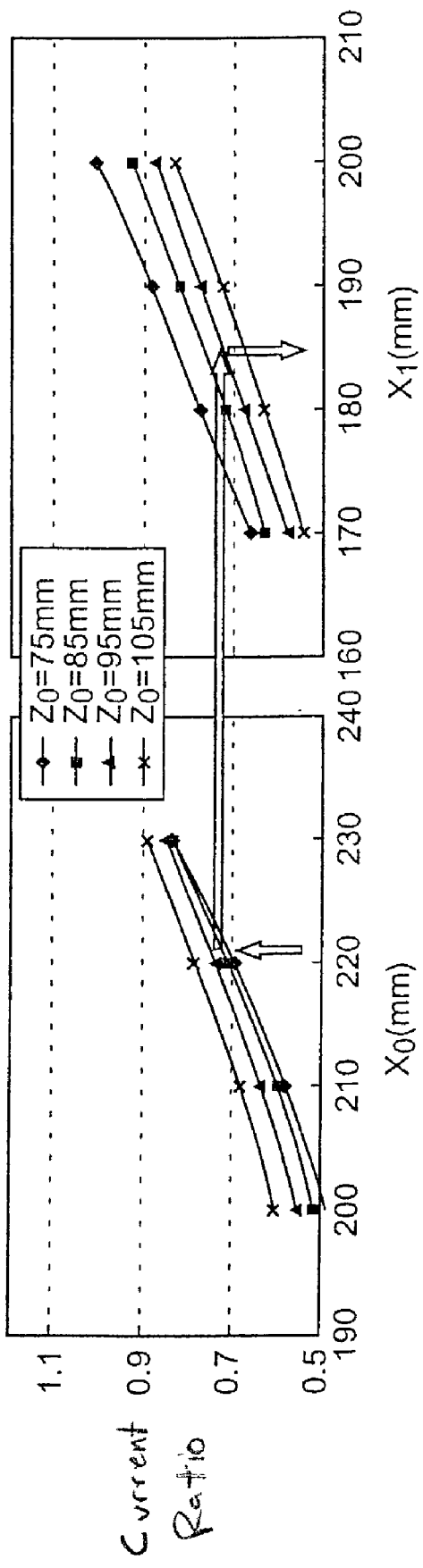

ns and the magnetic field produced with the sub-magnetic coil sections is suppressed. This makes it possible to form optimum or magnetic field intensity distribution by regulating electric currents applied to the main magnetic coil sections and to the sub-magnetic coil sections.

METHOD AND APPARATUS FOR CONTROLLING THE MAGNETIC FIELD INTENSITY IN A PLASMA ENHANCED SEMICONDUCTOR WAFER PROCESSING CHAMBER

CROSS-REFERENCE TO RELATED APPLICATIONS

This application claims benefit Japanese patent applications serial number 2001-335364, filed Oct. 31, 2001, and serial number 2001-206905, filed Jul. 6, 2001, which are herein incorporated by reference.

BACKGROUND OF THE INVENTION

1. Field of the Invention

This invention relates to a magnetism generator, in a plasma enhanced semiconductor wafer processing chamber, for generating a magnetic field in a reaction chamber.

2. Description of the Related Art

Some of the semiconductor manufacturing chambers such as a dry etching chamber and a chemical vapor deposition (CVD) chamber manufacture semiconductor devices with plasma formed in a reaction chamber. Some of such semiconductor wafer processing chambers are of a type in which a magnetic field is produced within the reaction chamber by providing a plurality of electromagnets around the reaction chamber to accelerate formation of the plasma.

With this conventional technique however, the intensity of the magnetic field tends to be greater on the edge of a wafer placed in the reaction chamber than in the center of the wafer. Therefore, when this method of producing a magnetic field is applied to the dry etching chamber, there is a problem that the etch rate and the selectivity are not uniform over the wafer surface. When the method is applied to a CVD chamber, there is a problem of nonuniformity in the film formation upon the wafer surface. Still another problem is that the electrical components formed on the wafer suffer charging damage due to a non-uniform plasma density.

Therefore, there is a need in the art for a method and apparatus for controlling a magnetic field in a semiconductor wafer processing chamber.

SUMMARY OF THE INVENTION

The present invention is a magnetic field generator in a semiconductor wafer processing chamber comprising a supporting member for supporting a substrate placed in a reaction chamber and a plasma forming means for forming plasma in the reaction chamber, to generate a magnetic field in the reaction chamber to accelerate the plasma formation. The plasma forming means comprises a plurality of main magnetic coil sections for forming a magnetic field generally parallel to the top surface of the supporting member, and a plurality of sub-magnetic coil sections, placed generally coaxially with the main magnetic coil sections, for forming a magnetic field opposite in direction to the magnetic field formed with the main magnetic coil sections.

According to the invention, currents are applied to the main and sub magnetic coil sections in such a manner that the magnetic field produced with the main magnetic coil sections is opposite in direction to the magnetic field produced with the sub-magnetic coil sections. As a result, the magnetic field of one polarity is superimposed on magnetic field of opposite polarity, and a differential between the magnetic fields produced with the main magnetic coil sec-

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 18(a), 18(b) and 18(c) respectively show tables of relations of the sub-magnetic coil dimensions to the optimum current ratios in the bar component, the magnetic field uniformity, and the relative magnetic field intensity in the wafer center, for the bar component.

FIGS. 23(a), 23(b) and 23(c) respectively show tables of relations of the sub-magnetic coil dimensions to the optimum current ratios in the bar component, the magnetic field evenness, and the relative magnetic field intensity in the wafer center, for the pole component.

FIGS. 24(a) and 24(b) respectively show the optimum current ratio in the bar component and in the pole component of the sub-magnetic coil.

DETAILED DESCRIPTION

Figure 1:
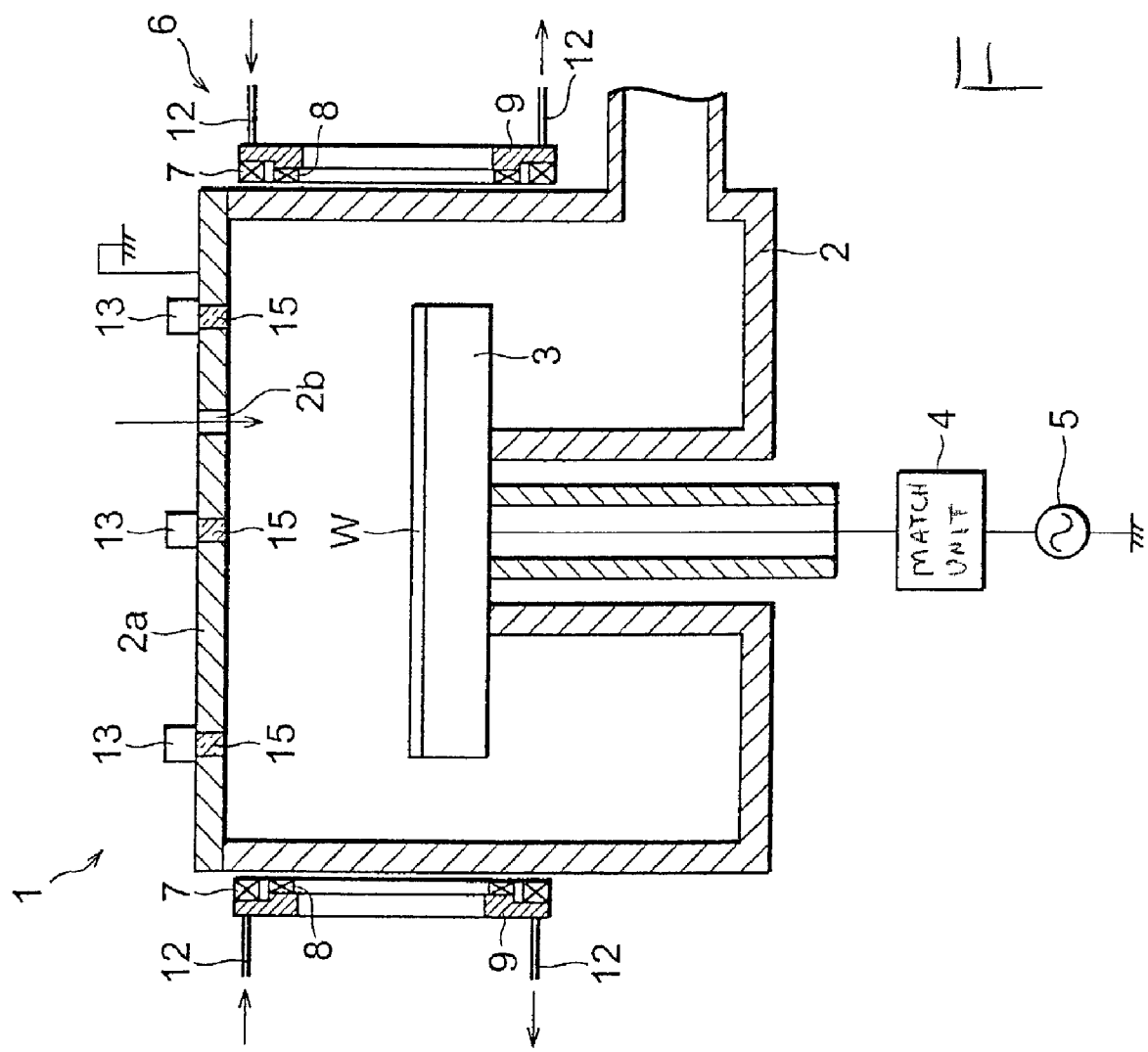
FIG. 1 is a general constitutional drawing of a dry etching chamber as an embodiment of a semiconductor manufacturing chamber according to the invention.

FIG. 1 is a general drawing of a dry etching chamber as an embodiment of the semiconductor wafer processing chamber according to the invention. As shown, an etching chamber 1 has a reaction chamber 2 evacuated with a pump (not shown) down to a low pressure. A lid 2a serving as part of the reaction chamber 2 is used as an upper electrode and grounded. The lid 2a is provided with a gas inlet 2b for supplying etching gas to the interior of the reaction chamber 2. A support pedestal 3 for supporting a wafer W in the reaction chamber 2 serves as a lower electrode. An RF power supply 5 is connected to the support pedestal 3 through a match unit 4 to supply electric power (such as 13.56 MHz) to the support pedestal 3 and produce plasma in the reaction chamber 2.

To perform an etching process with the etching chamber 1, a wafer W is transferred into the reaction chamber 2 using a transfer robot (not shown) and placed on the support pedestal 3, and radio frequency electric power is applied by the RF power supply 5 to the support pedestal 3 while introducing an etching gas through the gas inlet 2b into the reaction chamber 2. Then, plasma discharge occurs between the support pedestal 3 and the lid 2a, the etching gas is activated, and the surface of the wafer W is etched.

Figure 2:
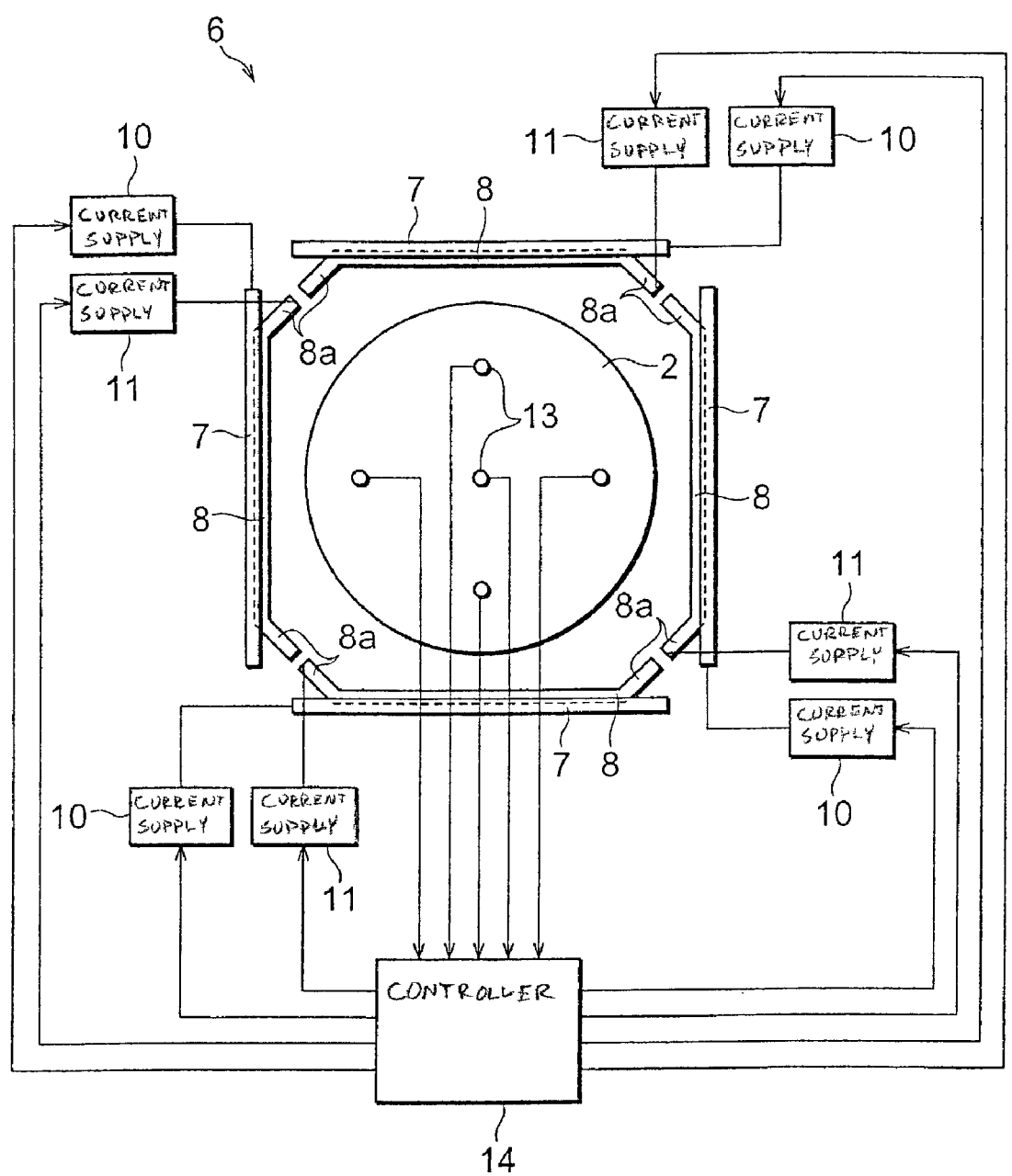
FIG. 2 is a constitutional drawing of a magnetic field generator of the dry etching chamber shown in FIG. 1.
Figure 3:
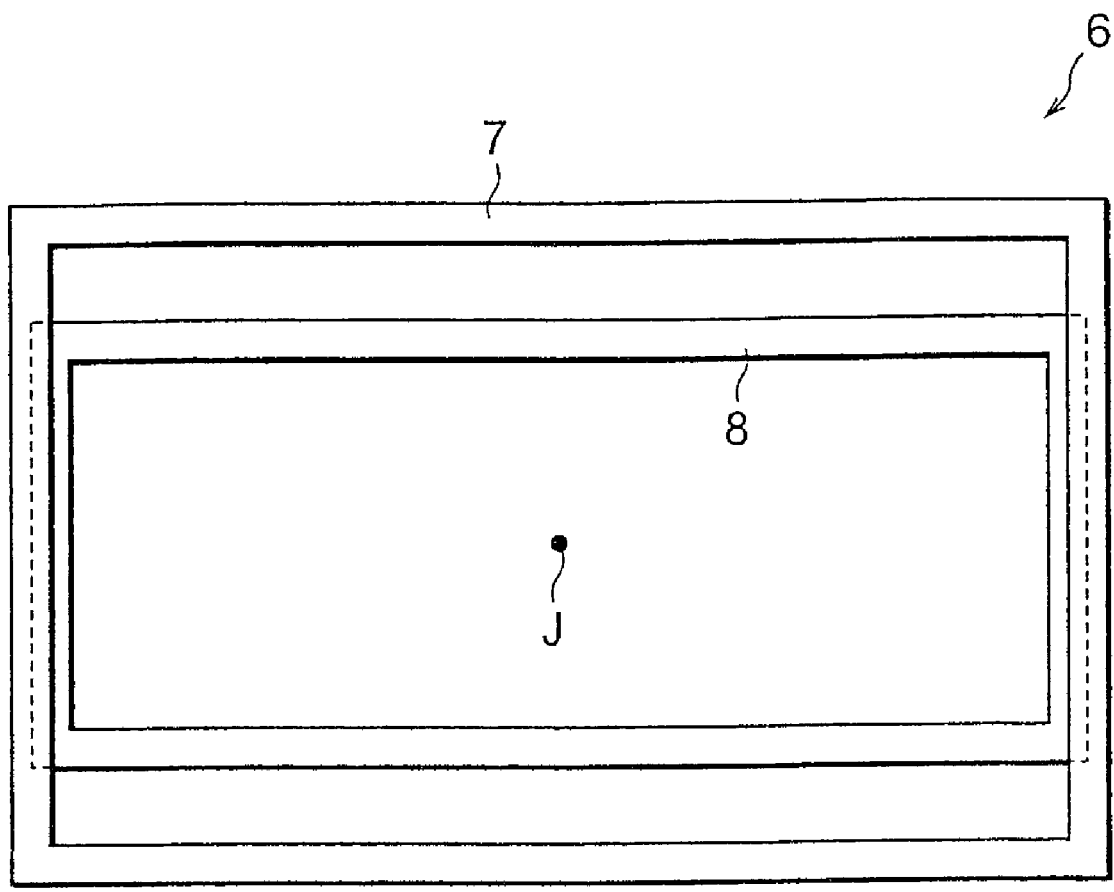
FIG. 3 is a side view of the main magnetic coil section and the sub-magnetic coil section shown in FIG. 2.

The etching chamber 1 comprises a magnetic field generator 6 that produces a magnetic field in the reaction chamber 2 for accelerating the plasma formation described above. The magnetic field generator 6 is placed as shown in FIGS. 1 to 3 around the reaction chamber 2 and comprises, a plurality (four) of main magnetic coil sections 7 placed around the reaction chamber 2 to produce a magnetic field nearly parallel to the top surface of the support pedestal 3, and four sub-magnetic coil sections 8 placed on nearly the same axis J as the respective main magnetic coil sections 7 to produce a magnetic field opposite in direction to the magnetic field produced with the main magnetic coil sections 7.

The main magnetic coil sections 7 and the sub-magnetic coil sections 8 are formed by winding wires along a rectangular frame 9. The wires of the magnetic coil sections 7 and 8 are wound in the same direction.

The sub-magnetic coil section 8 is made smaller in size than the main magnetic coil section 7 by making the sub-magnetic coil section 8 lower in height than the main magnetic coil section 7. Here, in order to make the sub-magnetic coil section 8 smaller in size than the main magnetic coil section 7, both of the vertical and lateral dimensions of the sub-magnetic coil section 8 may be made smaller than those of the main magnetic coil section 7. However, since a load lock chamber and other chambers are placed around the reaction chamber 2, the space around the reaction chamber 2 for placing the main and sub-magnetic coil sections 7 and 8 is limited. Therefore, it is efficient to reduce only the height dimension of the sub-magnetic coil section 8.

The sub-magnetic coil section 8 may be placed nearer to the reaction chamber 2 than the main magnetic coil section 7. Both ends of the sub-magnetic coil section 8 are provided with bent portions 8a bent toward the reaction chamber 2.

A current supply 10 is connected to the main magnetic coil section 7. A current supply 11 is connected to the sub-magnetic coil section 8. In this way, currents applied to the main and sub-magnetic coil sections 7 and 8 may be set individually.

The frame 9 provided with the main and sub-magnetic coil sections 7 and 8 is formed with cooling passages (not shown) to which are connected cooling pipes 12. As cooling water (or another form of coolant) is made to flow through the cooling pipes 12 and through the cooling passages in the frame 9, the main and sub-magnetic coil sections 7 and 8 are cooled. Incidentally, cooling air may be used in place of cooling water.

Optionally, the magnetic field generator 6 has a plurality (five) light sensors 13 in positions on the lid 2a of the reaction chamber 2, and a controller 14 connected to respective light sensors 13. The lid 2a is provided with plurality of windows 15 in positions corresponding to the central and edge positions of the wafer W supported on the support pedestal 3. The light sensors 13 are placed on respective windows 15. The light sensors 13 detect process characteristics in the center and plurality of edge positions on the wafer W by casting light onto the wafer W, receiving the reflected light, converting the light intensity into electric signals, and sending the signals to the controller 14. The controller 14 detects the process characteristics at the plurality of positions on the wafer W from the data detected with the light sensors 13, controls the current supplies 10 and 11 according to the process characteristics detected, and controls the magnetic field intensity distribution in the reaction chamber 2. Alternatively, the light sensors 13 may detect light emissions from the plasma and send the electrical signal indicative of the light measurements to the controller 14.

During processing of the wafer W, electric currents are supplied from the current supplies 10 and 11 to the four sets of the magnetic coil sections 7 and 8 to produce a magnetic field nearly parallel to the wafer W. The magnetic field may be rotated in steps or continuously about the wafer W. The angular direction of rotation and intensity of the magnetic field are dependent on the currents applied to the magnetic coil sections 7 and 8.

To continuously rotate the magnetic field, it is effective to apply to the four sets of the magnetic coil sections 7 and 8 electric currents in proportion to a sine function or a cosine function with respect to time. For example, to the four sets of the magnetic coil sections 7 and 8 are applied currents changing with time as described below.

TABLE 1

| | Main magnetic coil section | Sub-magnetic coil section |
|---|---|---|
| 1 | Asin(Bt) | (−x)Asin(Bt) |
| 2 | (−A)cos(Bt) | (−x)(−A)cos(Bt) |
| 3 | (−A)sin(Bt) | (−x)(−A)sin(Bt) |
| 4 | Acos(Bt) | (−x)Acos(Bt) |

In Table 1, 'A' and 'B' are constants, and 'x' is a correction factor for the sub-magnetic coil sections relative to the main magnetic coil sections, to be adjusted as required.

As for the dry etching chamber using a magnetic field, it is known that the electron drift phenomenon occurs in the direction normal to the line of magnetic force and so gradient appears in the plasma density and in the potential distribution on the wafer. In particular, the potential distribution gradient on the wafer is thought to be a cause of charging damage and so its reduction is desirable. To obtain even distribution by offsetting the electron drift effect, it is effective to apply artificial gradient to the magnetic field. For that purpose, the following current distribution is effective.

In Table 2, 'y' represents a parameter for the control of magnetic field gradient. Other parameters have the same meaning as those in Table 1. Since continuous angular rotation is difficult in this case, states of the phases 1, 2, 3, and 4 are switched in steps to obtain uniform results.

Next will be described the idea of improving the magnetic field intensity distribution using the sub-magnetic coil sections in the etching chamber provided with the magnetic field generator described above.

Figure 4:
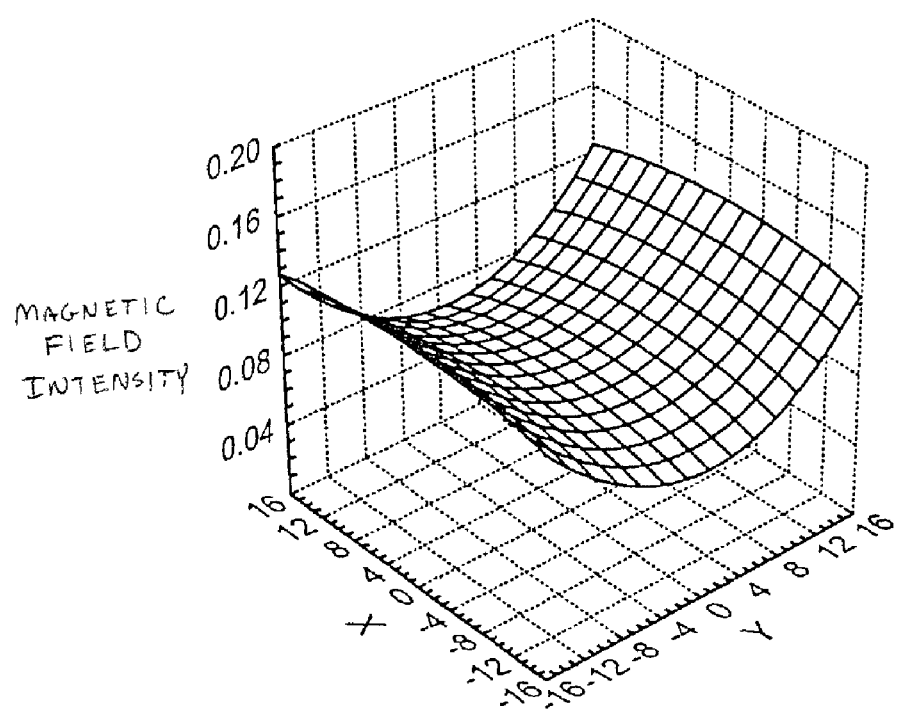
FIG. 4 is a model drawing of an example of magnetic field intensity distribution produced with a pair of magnetic coils.
Figure 5:
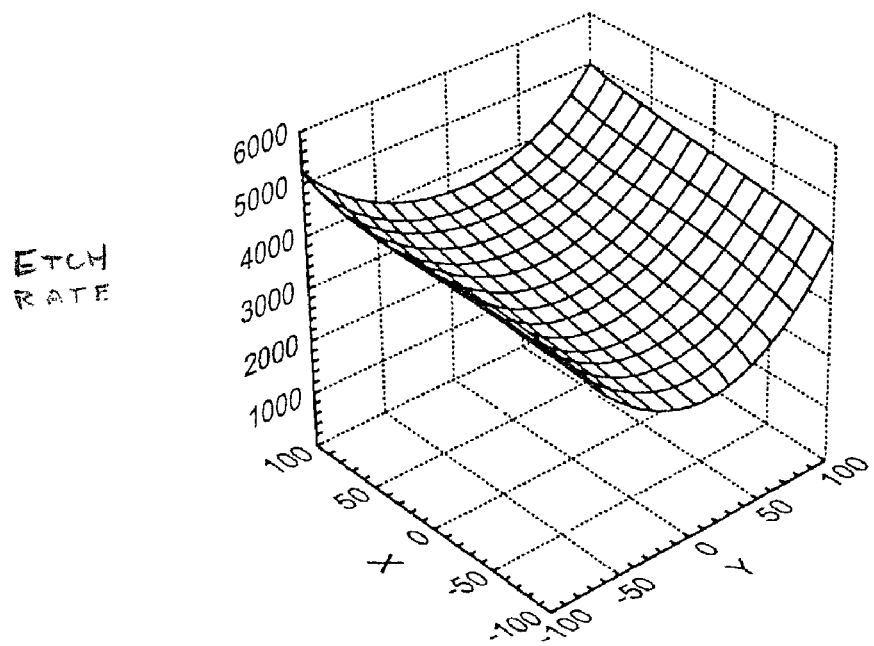
FIG. 5 is a model drawing of an example of etch rate distribution.

As for the etching process in general, one of the major causes of non-uniformity in the etch rate across the wafer surface is the non-uniformity in the magnetic field intensity distribution. FIG. 4 is a model drawing of an example of magnetic field intensity distribution produced across a wafer with a pair of magnetic coils. As shown, the magnetic field intensity on the edges (Y=±16 cm) of the wafer located near the magnetic coil are higher by about 50% than the magnetic field intensity in the wafer center. As shown in FIG. 5, the magnetic field intensity distribution has correlation with the distribution of the etch rate.

FIG. 5 is a model drawing of etch rate distribution of a high aspect ratio recipe, specifically using an etching gas, mixture of gasses $C_4$, $F_6$, $O_2$, and Ar, with the internal pressure of the reaction chamber at 40 mtorr, magnetic field intensity at 100 G (gauss), and electric power applied to the support pedestal at 1500 W. As seen from FIGS. 4 and 5, the magnetic field intensity and the etch rate are increasing toward the ends of the Y-axis, toward the magnetic coils. The etch rate distribution has an asymmetric distribution along the X-axis. This is due to the electron drift occurring in the direction normal to the magnetic field. In practical processes, the magnetic field is usually rotated with a sine curve or switched with a configurable magnetic field (CMF).

The non-uniformity in the etch rate occurs even when the magnetic field is rotated or switched as described above. The non-uniformity in the magnetic field intensity cannot be eliminated by rotation because it is symmetric. To obtain a uniform etch rate distribution with a high intensity magnetic field, it is desirable to make the magnetic field intensity distribution uniform.

The magnetic field also affects the self-bias voltage ($V_{dc}$). $V_{dc}$ is defined as a wafer potential produced by offsetting a positive current due to ions with a negative current due to electrons. If the $V_{dc}$ is not uniform across the wafer surface, a local current may occur on the wafer. Such a local current causes charging damage on the insulation gates of MOS devices.

Figure 6B:
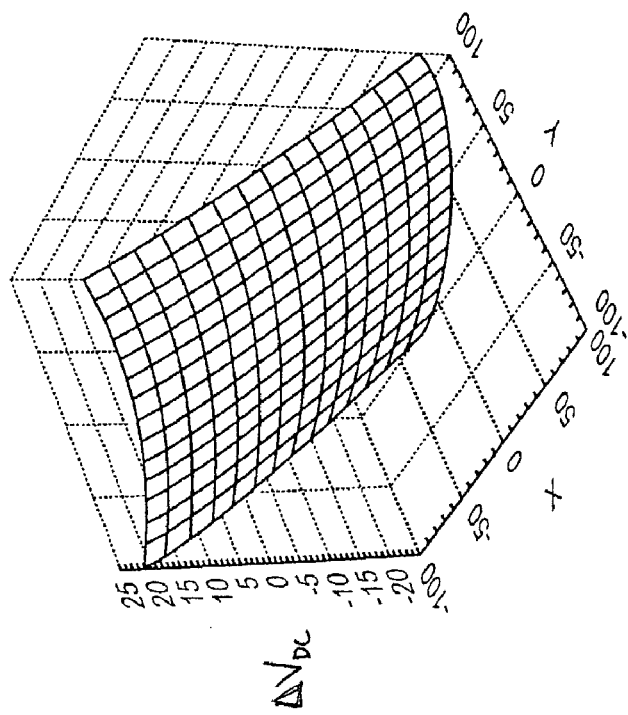
FIGS. 6(a) and 6(b) respectively show model graphs of instantaneous magnetic field intensity distribution and ΔVdc distribution when a sine curve current is applied to a magnetic coil.
Figure 6A:
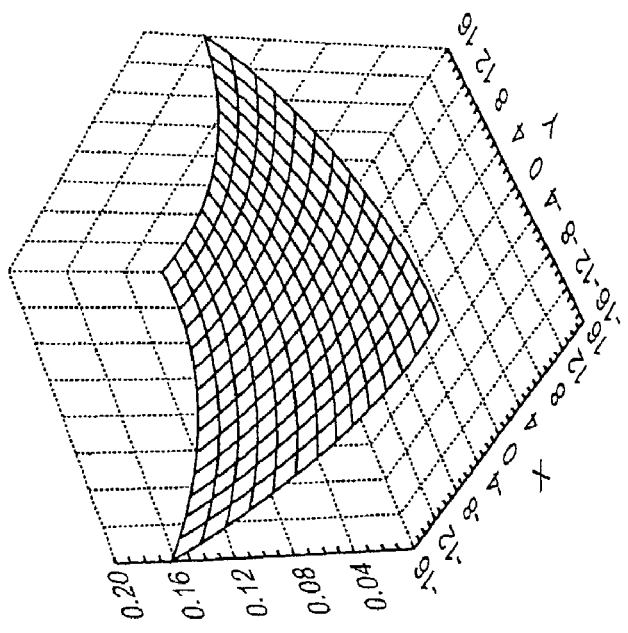

FIG. 6(a) is a model drawing of a magnetic field intensity distribution at a moment at which the magnetic field direction is at 45 degrees relative to one magnetic coil with a sine curve electric current supplied to the magnetic coil. Here, the CMF was 1.0 and no artificial gradient is applied to the magnetic field. FIG. 6(b) is a model drawing of $\Delta V_{dc}$ distribution corresponding to the magnetic field intensity

TABLE 2

| | Phase 1 | | Phase 2 | | Phase 3 | | Phase 4 | |
|---|---|---|---|---|---|---|---|---|
| | Main magnetic coil section | Sub-Magnetic coil section | Main magnetic coil section | Sub-Magnetic coil section | Main Magnetic coil section | Sub-Magnetic coil section | Main magnetic coil section | Sub-magnetic coil section |
| 1 | A | (−x)A | yA | (−xy)A | y(−A) | (−xy)(−A) | (−A) | (−x)(−A) |
| 2 | (−A) | (−x)(−A) | A | (−x)A | yA | (−xy)A | y(−A) | (−xy)(−A) |
| 3 | Y(−A) | (−xy)(−A) | (−A) | (−x)(−A) | A | (−x)A | yA | (−xy)A |
| 4 | yA | (−xy)A | y(−A) | (−xy)(−A) | (−A) | (−x)(−A) | A | (−x)A | distribution of FIG. 6(a). As seen in FIG. 6, while the magnetic field intensity is symmetric with respect to the diagonal, the $\Delta V_{dc}$ is increasing in the direction from the right to the left side of the graph. The drift in the magnetic field occurs in that direction. At this time, a current causes damage on the wafer. However, rotating the magnetic field with a sine curve cannot avoid charging damage by compensating for the non-uniformity in the $\Delta V_{dc}$ because the rotating speed of the magnetic field is as slow as 20 rpm. Therefore, the above-mentioned CMF is used.

Figure 7B:
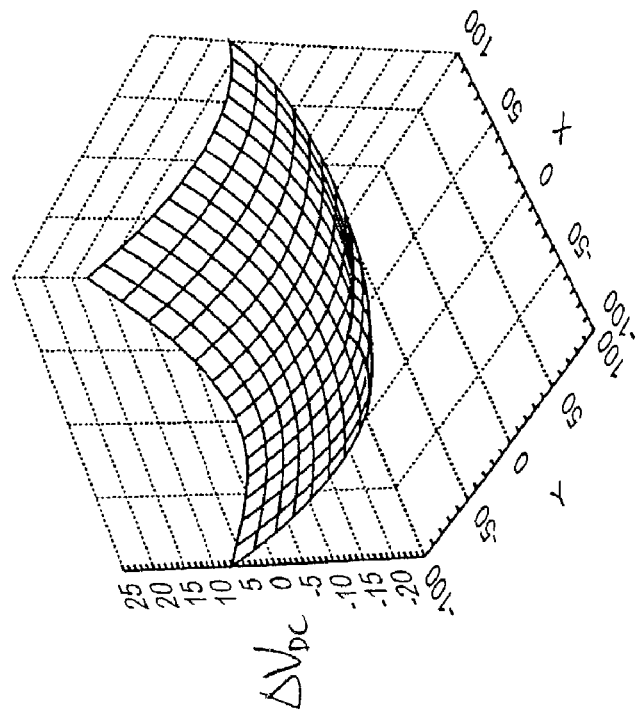
FIGS. 7(a) and 7(b) respectively show model graphs of magnetic field intensity distribution and ΔVdc distribution with a CMF constitution.
Figure 7A:
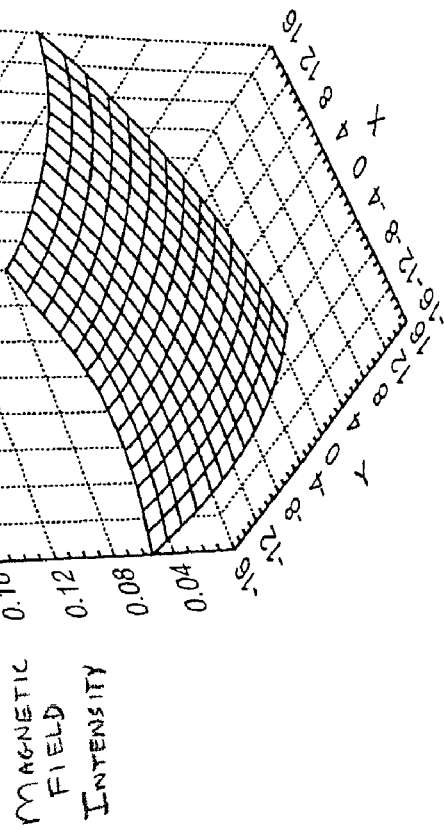

FIG. 7(a) is a model drawing of a magnetic field intensity distribution in a magnetic field configuration with a CMF of 0.3. FIG. 7(b) is a model drawing of $\Delta V_{dc}$ distribution at that time. As seen from FIG. 7, though the magnetic field intensity is not symmetric, the $\Delta V_{dc}$ is nearly symmetric. This is because the non-uniform magnetic field of the CMF corrects the drift effect. However, even after the correction with the CMF, the $\Delta V_{dc}$ distribution is asymmetric between the center and the edges of the wafer. This is because the magnetic field intensity distribution has a gradient that is not linear but curved.

As described above, the magnetic field produced with a single magnetic coil has a gradient. The magnetic field has a higher intensity at a point near the magnetic coil than at a point distant from the magnetic coil. One of simple methods of making the magnetic field uniform is to increase the size of the magnetic coil. However, even if the dimensions of the magnetic coil are increased by 25% in all the directions of X, Y and Z, the reduction in the magnetic field nonuniformity is only from 55% to 35%. Therefore, improving the magnetic field uniformity with a single magnetic coil is impracticable.

Figure 8:
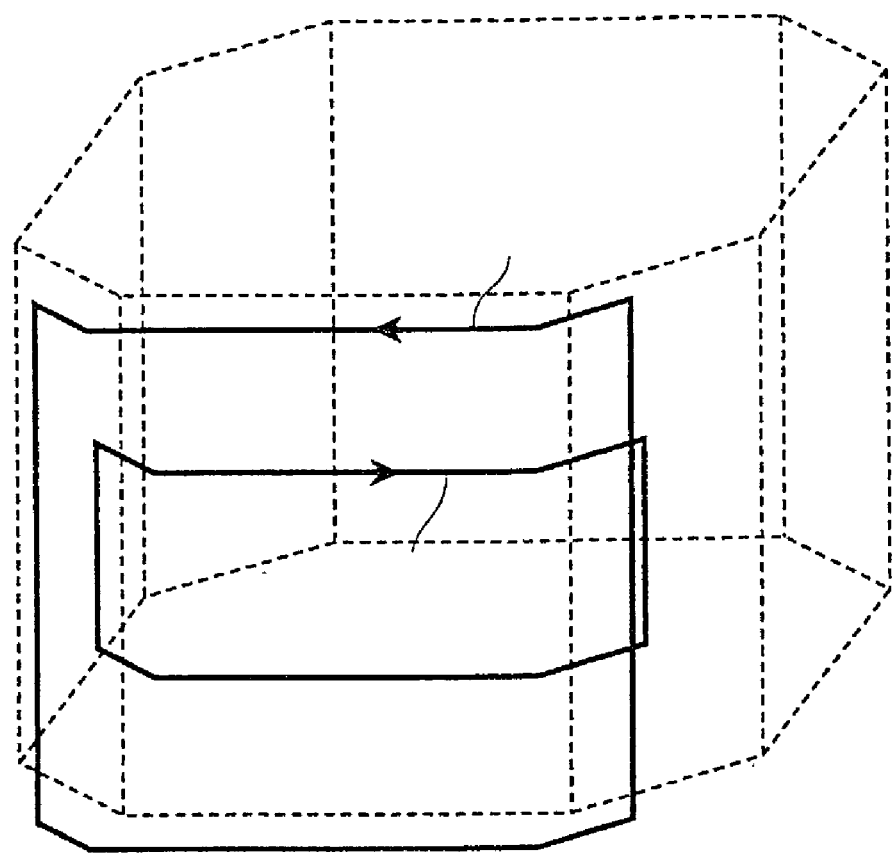
FIG. 8 is a model drawing showing a main magnetic coil section and a sub-magnetic coil section.

Therefore, the use of the sub-magnetic coil described before has been devised. The concept of the sub-magnetic coil is shown in FIG. 8. As shown, the sub-magnetic coil is sized to be smaller than the main magnetic coil. Moreover, the magnetic field produced with the sub-magnetic coil is formed in the opposite direction to that produced with the main magnetic coil.

Figure 9:
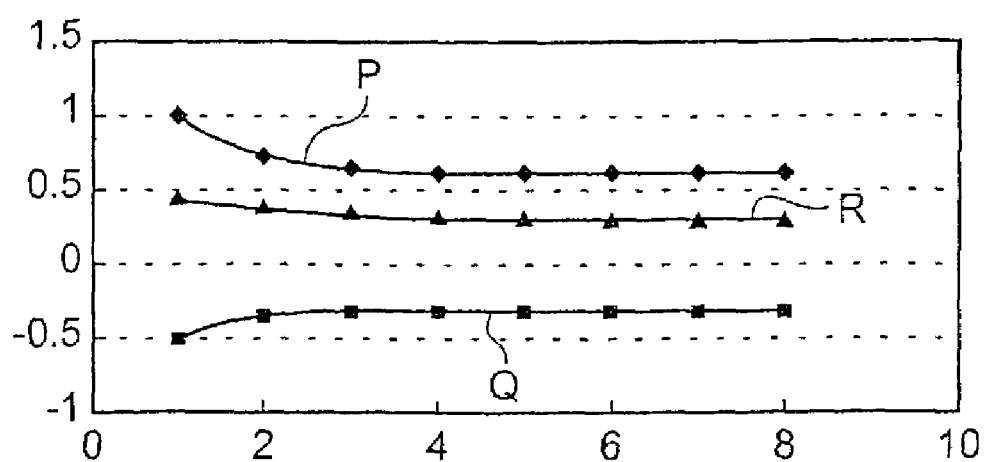
FIG. 9 shows an example of magnetic field intensity distribution produced by the use of a main magnetic coil section and a sub-magnetic coil section.

FIG. 9 shows an example of the magnetic field intensity distribution produced with the main magnetic coil and the sub-magnetic coil. In FIG. 9, the main magnetic coil is 320 mm in height while the sub-magnetic coil is 200 mm in height. In FIG. 9, the horizontal axis indicates the distance from a reference point while the vertical axis indicates the relative value of the magnetic field intensity. The letter P identifies the magnetic field intensity distribution produced with the main magnetic coil, while Q identifies the magnetic field intensity distribution produced with the sub-magnetic coil. The letter R identifies the resultant magnetic field intensity distribution resulting from superimposing the magnetic field produced with the main magnetic coil over the magnetism produced with the sub-magnetic coil.

As seen from FIG. 9, either the main magnetic coil or the sub-magnetic coil produces a magnetic field intensity distribution in which the intensity gradient increases from the center toward the edge of the wafer. Since the sub-magnetic coil is smaller in size than the main magnetic coil, the magnetic field intensity distribution produced with the sub-magnetic coil is directed opposite the gradient produced with the main magnetic coil. As a result of superimposing the magnetic field produced with the main magnetic coil over the magnetic field produced with the sub-magnetic coil, the magnetic field intensity distribution is more uniform in comparison with an arrangement without a sub-magnetic coil.

Figure 10:
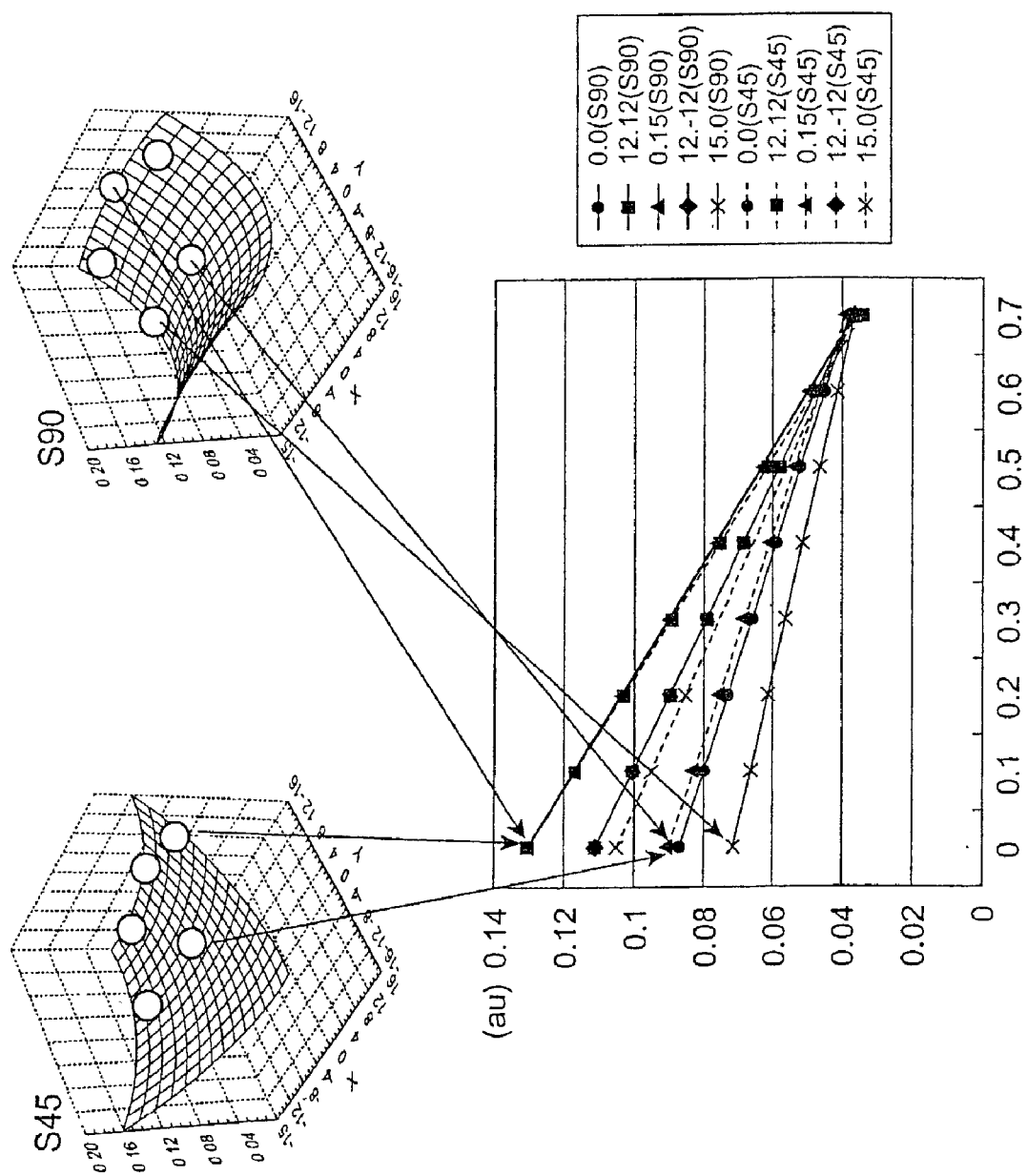
FIG. 10 shows a model graph of an instantaneous magnetic field intensity distribution when sine curve currents are applied to the main and sub-magnetic coil sections and a graph of the change in the magnetic field intensity when the current applied to the sub-magnetic coil is changed in the model.

FIG. 10 shows a graph of magnetic field intensity at different points on a wafer of a model at a certain instant and graphs of change in the magnetic field intensity at different points on the wafer when electric current applied to the sub-magnetic coil is changed.

In FIG. 10, the graph S90 upper right shows a magnetic field intensity at an instant (referred to as sine 90°) at which the magnetic field direction is at a right angle (90°) to one main magnetic coil when a sine curve current is applied to the magnetic coil. The graph S45 upper left shows a magnetic field intensity at an instant (referred to as sine 45°) at which the magnetic field direction is at 45 degrees to one main magnetic coil. In the graph at the lower center, the horizontal axis indicates the relative value of electric current applied to the sub-magnetic coil when the value of electric current applied to the main magnetic coil is assumed to be 1, and the vertical axis indicates the magnetic field intensity. The X-Y coordinates of the five points on the wafer surface used for the description are: (0, 0) corresponding to the wafer center, and (12, 12), (0, 15), (12,-12), and (15, 0) corresponding to the edges of the wafer.

As seen from FIG. 10, when the relative current value applied to the sub-magnetic coil is 0, or no current is applied to the sub-magnetic coil, the magnetic field intensity varies from point to point. On the other hand, the variance in the magnetic field intensity among the points decreases with the increase in the relative current value applied to the sub-magnetic coil. When the relative current value applied to the sub-magnetic coil is 0.7, the magnetic field intensity in all the points are almost the same.

It is seen from the above simulation results, a uniform magnetic field intensity distribution is obtained by controlling the electric current applied to the sub-magnetic coil. The uniformity in the magnetic field intensity distribution can be improved by appropriately choosing the ratio of current applied to the main magnetic coil to the current applied to the sub-magnetic coil according to the ratio of the number of turns of the main magnetic coil to that of the sub-magnetic coil and according to the dimensional difference between the main magnetic coil and the sub-magnetic coil.

Next will be described the principle and dimensions of the magnetic coils. The optimum current to be applied to the sub-magnetic coil decreases with the decrease in the size of the sub-magnetic coil relative to the main magnetic coil. However, the space for the magnetic coil is restricted by the size of the reaction chamber, the space for the slit valve, adjacent chambers, etc.

Figure 11:
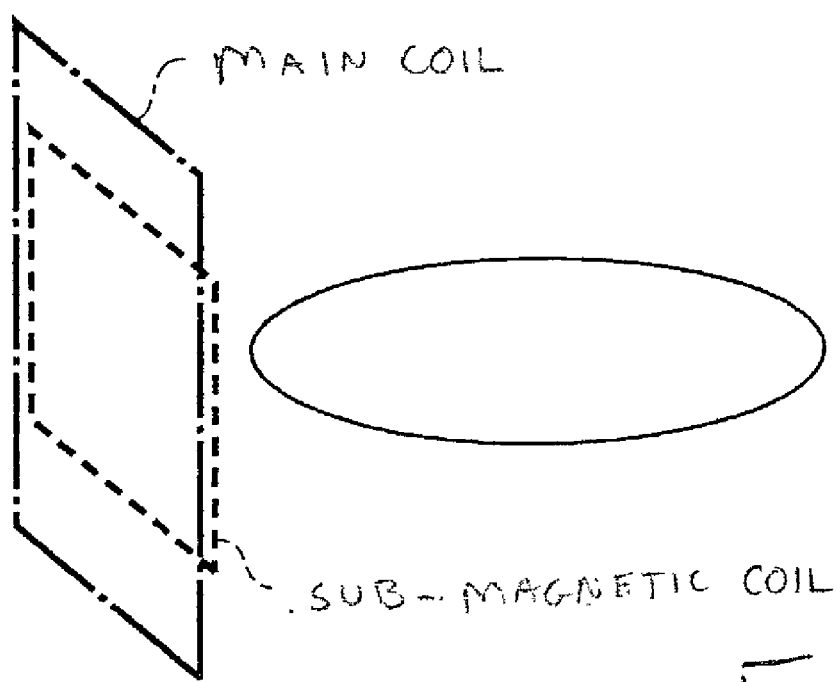
FIG. 11 shows a simple design example of a sub-magnetic coil suitable for an actual reaction chamber.

FIG. 11 shows a simplified example of a sub-magnetic coil suitable for a reaction chamber. Analysis of the magnetic field produced with the rectangular magnetic coil is divided for convenience into that for the bar portion (along the Y-axis) and that for the pole portion (along the Z-axis).

Figure 12:
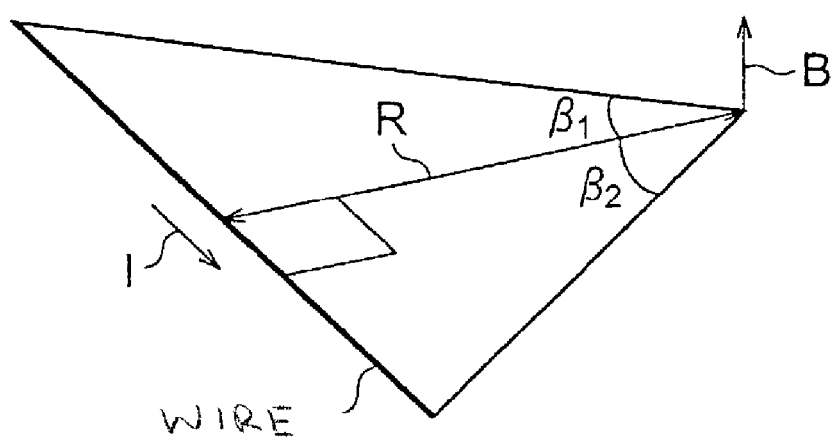
FIG. 12 shows a magnetic field produced with a linear electric wire.

FIG. 12 shows the magnetic field produced with a linear electric wire. In the figure, the magnetic field intensity at a point is expressed with the following equation, a function of the distance from the linear electric wire. The equation can be used to evaluate the magnetic field intensity distribution produced with the bar portion and the pole portion of the sub-magnetic coil, and to evaluate the effect of the sub-magnetic coil.

$$|B|=(I/4\pi R)(\sin \beta_1 + \sin \beta_2) \qquad \text{Equation 1}$$

Figure 13:
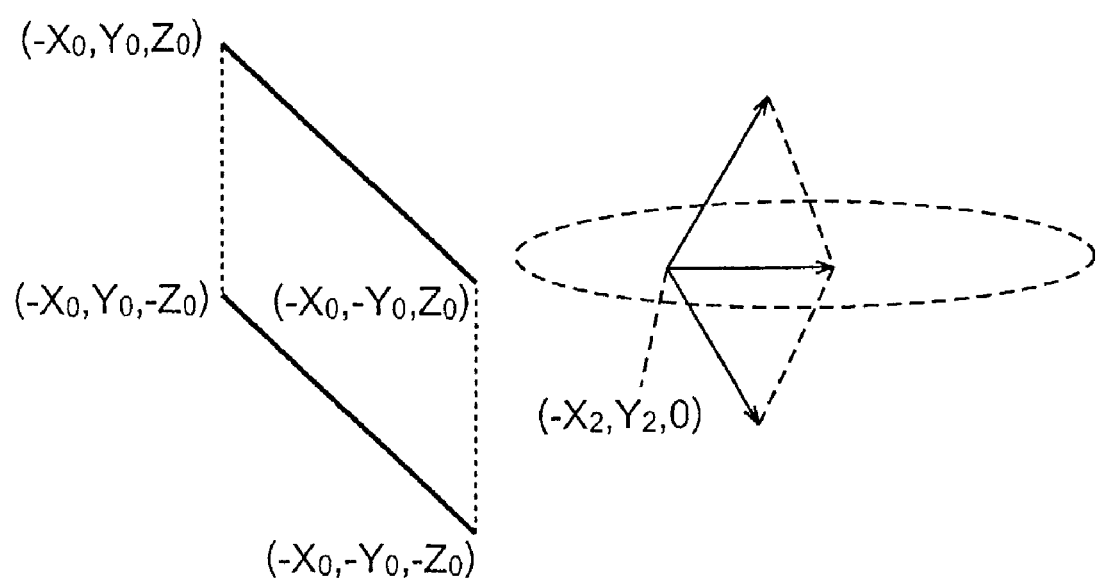
FIG. 13 shows the bar component of a magnetic field produced with a magnetic coil.

FIG. 13 shows the bar component of the magnetic field produced with the magnetic coil. In the figure, the center of the X-Y-Z coordinate system is assumed to be the center of the wafer. Since the magnetic field produced with the top bar portion and that produced with the bottom bar portion offset each other, the Z component of the magnetic field is zero. Since electric current flows in the direction of the Y axis, the Y component of the magnetic field is also zero. Therefore, only the X component of the magnetic field is considered. The bar component of the magnetic field produced with the magnetic coil is about ⅔ of the total magnetic field produced with the magnetic coil. The bar component of the magnetic field causes non-uniformity in of the magnetic field intensity distribution.

Figure 14:
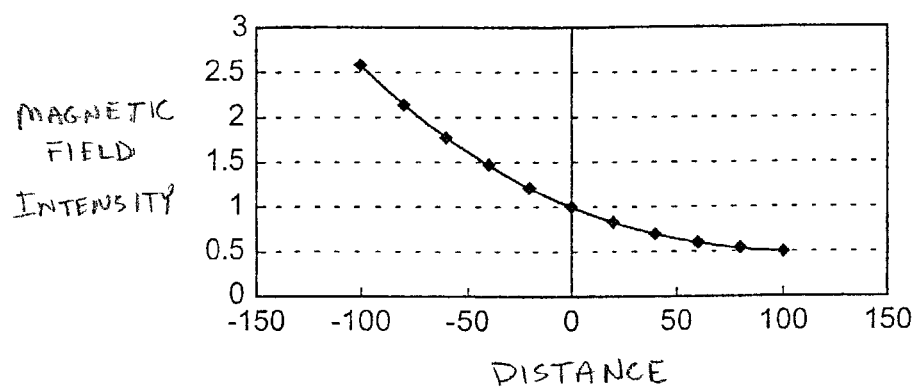
FIG. 14 shows the bar component of a magnetic field produced with a single magnetic coil.

FIG. 14 shows the bar component of the magnetic field along the X axis when a single magnetic coil is used. Here, $X_0$ is 220 mm, $Y_0$ is 170 mm, and $Z_0$ is 135 mm. As seen from FIG. 14, the magnetic field intensity decreases not linearly but along a curve.

Figure 15:
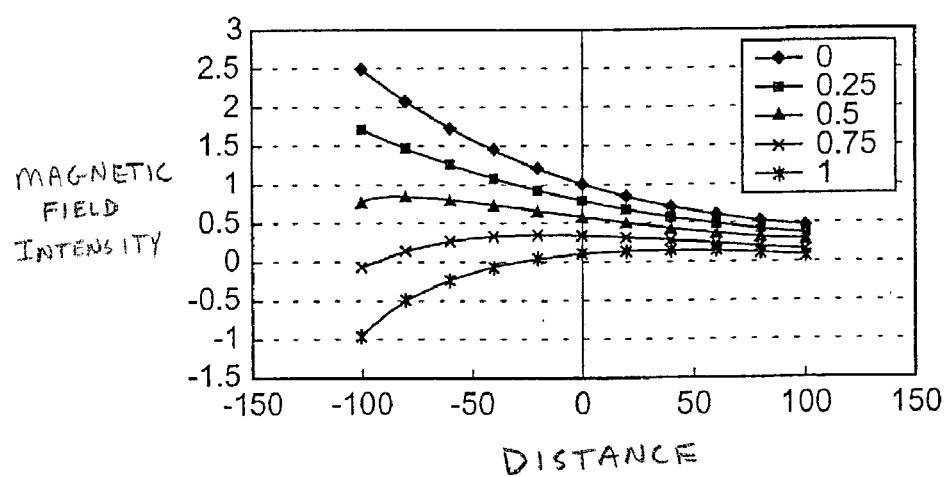
FIG. 15 shows the bar component of a magnetic field produced with a set of main and sub-magnetic coils.

FIG. 15 shows the bar components of the magnetic field on the wafer when a set of main and sub-magnetic coils are used. As for the coil dimensions, $X_0$ is 220 mm, $Y_0$ is 170 mm, and $Z_0$ is 135 mm for the main magnetic coil and $X_0$ is 200 mm, $Y_0$ is 170 mm, and $Z_0$ is 75 mm for the sub-magnetic coil. The parameter values (0 to 1.0) in the box in FIG. 15 are the current values in the sub-magnetic coil relative to that in the main magnetic coil. As seen from FIG. 15, the magnetic field intensity distribution is the closest to be linear when the ratio of current in the sub-magnetic coil to the current in the main magnetic coil is 0.5.

Figure 16:
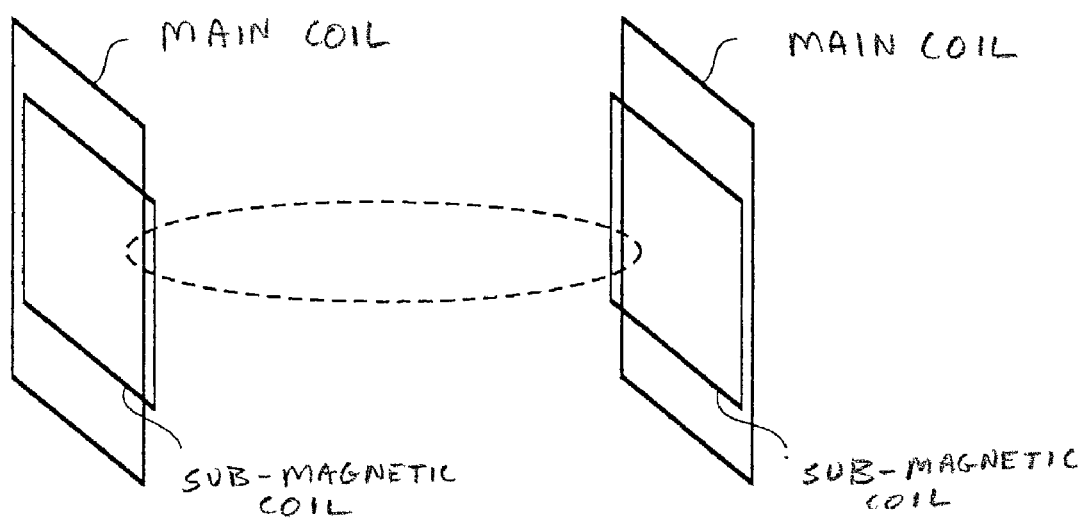
FIG. 16 shows the state when two sets of main and sub-magnetic coils are used.
Figure 17:
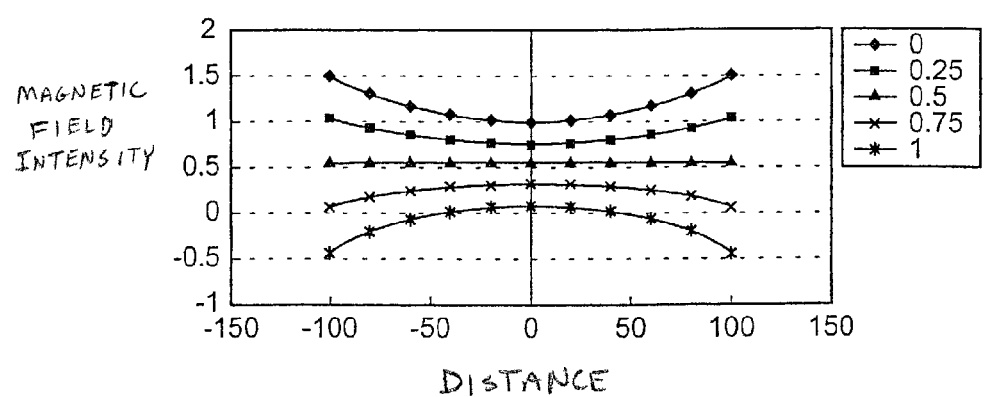
FIG. 17 shows the bar component of a magnetic field produced with two sets of main and sub-magnetic coils.

FIG. 16 shows the state when two sets of main and sub-magnetic coils are used. FIG. 17 shows the bar components of the magnetic field produced with the above arrangement. As seen from FIG. 17, the linear gradient occurring when the current ratio of the sub-magnetic coil is 0.5 shown in FIG. 15 is offset, so that the bar component of the magnetic field becomes considerably uniform (3 σ/ave=3.7%). Additionally, the magnetic field intensity in the wafer center is about half that produced without the sub-magnetic coil.

FIG. 18(a) shows a table of relation between the sub-magnetic coil dimensions and the optimum current ratios. FIG. 18(b) shows a table of relation between the sub-magnetic coil dimensions and the magnetic field intensity non-uniformity (in the 3 σ/ave in the 100 mm×100 mm area). FIG. 18(c) shows a table of relation between the sub-magnetic coil dimensions and the magnetic field intensity at the wafer center (values relative to the wafer center's magnetic field without a sub-magnetic coil). Those tables are used as guidance for designing the sub-magnetic coil. Incidentally, the main magnetic coil dimensions are kept unchanged that $X_0$ is 220 mm, $Y_0$ is 170 mm, and $Z_0$ is 135 mm. And the magnetic field uniformity is calculated in the area of 200 mm×200 mm.

The above tables indicate that the smaller the size of the sub-magnetic coil, the smaller the current in the sub-magnetic coil relative to the current in the main magnetic coil, and so the higher becomes the magnetic field intensity. Additionally, the magnetic field becomes uniform as the sub-magnetic coil size increases. However, even when the sub-magnetic coil size is the smallest ($X_0$=200 mm, $Z_0$=75 mm), the magnetic field uniformity (3.7%) is far better than that (53%) without the sub-magnetic coil.

Figure 19:
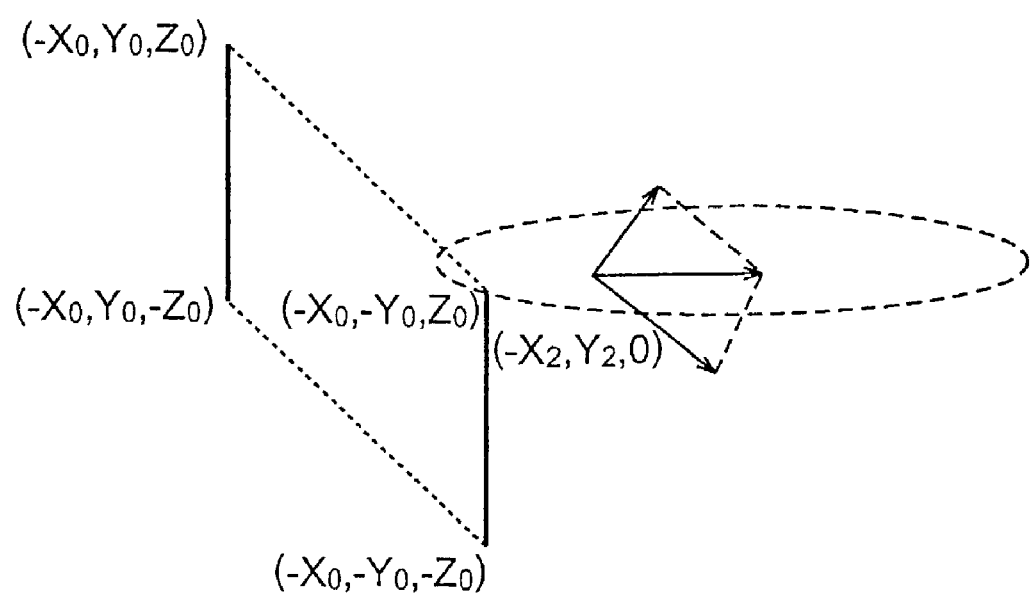
FIG. 19 shows the pole component of the magnetic field produced with the magnetic coil.

FIG. 19 shows the pole component of the magnetic field produced with a the magnetic coil. The pole component of the magnetic field is about 33% of total magnetic field produced with a magnetic coil. The pole component of the magnetic field causes non-uniformity in the diagonal direction, in particular at sine 45 degrees (described above) and non-uniformity in the CMF constitution.

Figure 20:
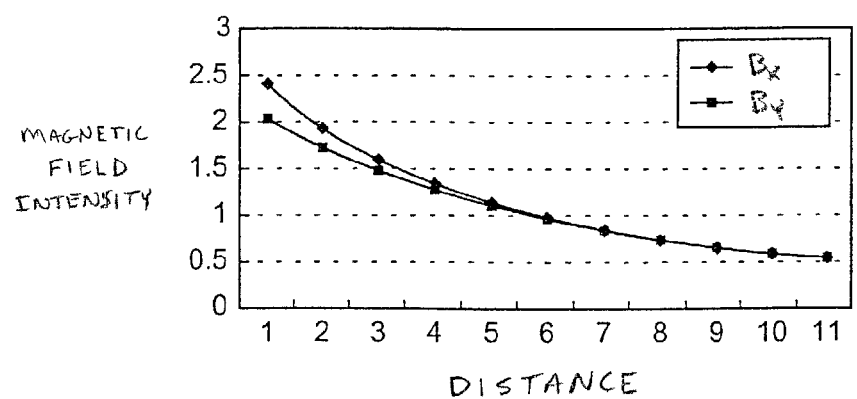
FIG. 20 shows the magnetic field intensity distribution of the pole component occurring in the diagonal direction without a sub-magnetic coil is provided.

FIG. 20 shows the magnetic field intensity distribution of the pole component produced in the diagonal direction without the sub-magnetic coil. In the figure are shown the magnetic field intensity $B_x$ of the X axis direction and $B_y$ of the Y axis direction.

Figure 21:
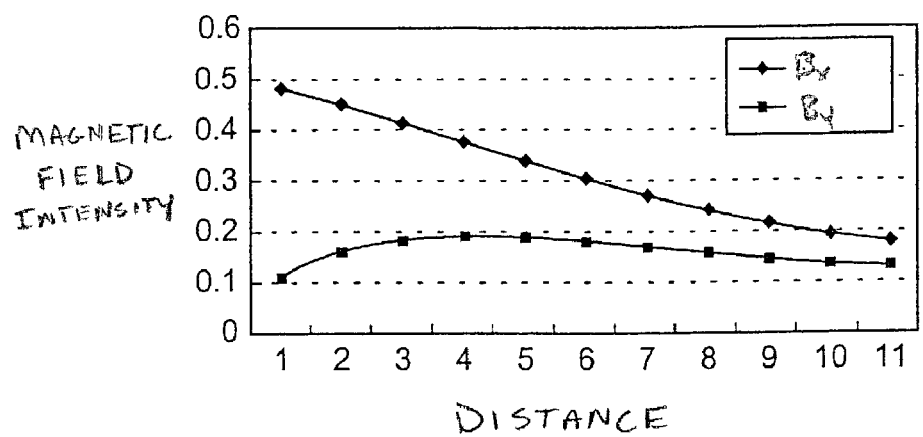
FIG. 21 shows the magnetic field intensity distribution of the pole component occurring in the diagonal direction when a sub-magnetic coil is provided.

FIG. 21 shows the magnetic field intensity distribution of the pole component produced in the diagonal direction with the sub-magnetic coil. To produce this graph, the current ratio in the sub-magnetic coil is 1.08. As for the dimensions of the main magnetic coil, $X_0$ is 220 mm, $Y_0$ is 170 mm, and $Z_0$ is 135 mm. The dimensions of the sub-magnetic coil are: $X_0$ is 200 mm, $Y_0$ is 170 mm, and $Z_0$ is 75 mm. As seen from FIG. 21, use of the sub-magnetic coil results in almost linear gradient of the magnetic filed intensity distribution. However, the current ratio of 1.08 of the sub-magnetic coil does not agree with the optimum current ratio of 0.53 of the sub-magnetic coil for the above-described bar component.

Figure 22:
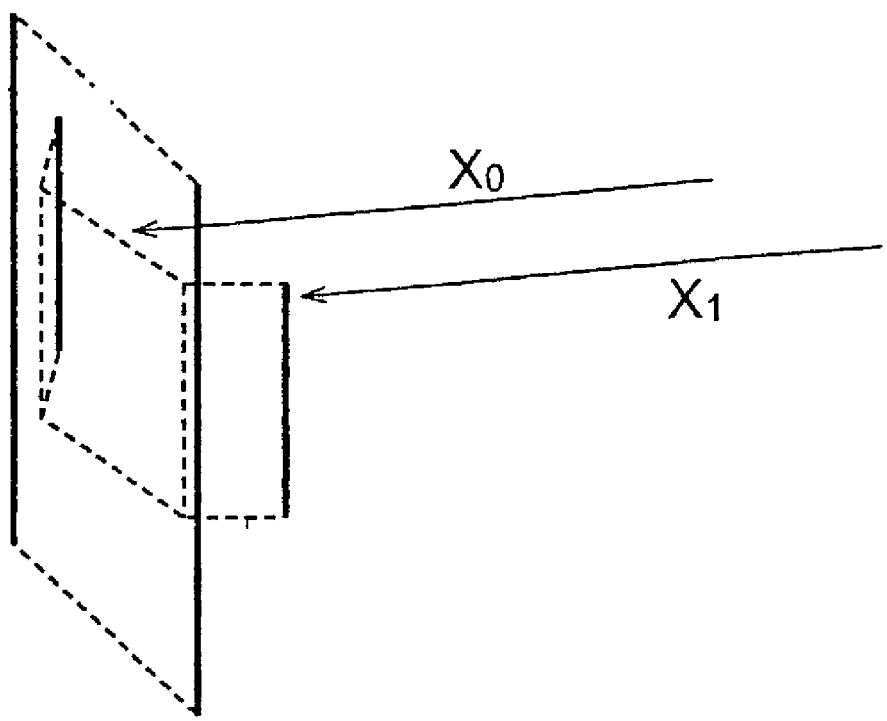
FIG. 22 shows a constitution of an optimum sub-magnetic coil.

To solve such an undesirable situation, the height $Z_0$ of the sub-magnetic coil is optimized and also as shown in FIG. 22, both ends of the sub-magnetic coil are provided with bent portions. Incidentally, $X_1$ is the X coordinate at the tip of the bent portion.

FIG. 23 shows tables, for the pole component, of relations of the sub-magnetic coil relative to the optimum current, magnetic field uniformity, and relative magnetic field intensity. As seen from FIG. 23(a), the optimum current ratio decreases with, the increase in the amount of bend (smaller $X_1$) and with the increase in the sub-magnetic coil height $Z_0$.

The tables shown in FIGS. 18 and 23 are useful for designing the sub-magnetic coil having both of the bar component and the pole component. FIG. 24 shows a method for determining dimensions of the sub-magnetic coil. FIG. 24(a) shows the optimum current ratio in the bar component of the sub-magnetic coil. FIG. 24(b) shows the optimum current ratio in the pole component of the sub-magnetic coil.

Figure 25:
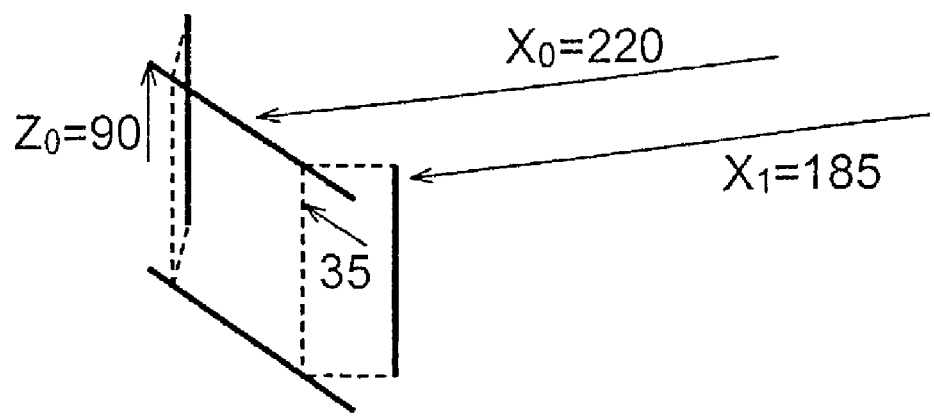
FIG. 25 shows an example of sub-magnetic coil dimensions determined by the method shown in FIG. 24.

From FIG. 24(a), when $X_0$ is 220 mm and $Z_0$ is 90 mm, the optimum current ratio in the bar component of the sub-magnetic coil is known as 0.73. In order to obtain the same current ratio in the pole component of the sub-magnetic coil here, $X_1$ should be 185 mm as seen from FIG. 24(b). Therefore, one of the optimum dimensional combinations conceivable of the sub-magnetic coil consists of dimensions, $X_0$=220 mm, $Z_0$=90 mm, and $X_1$=185 mm as shown in FIG. 25.

Next will be described a specific method of controlling the magnetic field intensity distribution by controlling the electric currents supplied to the main and sub-magnetic coils constituted as described above.

There are mainly two methods of applying current to the main and sub-magnetic coils. One is a sine mode in which current is applied in proportion to a sine or cosine function so that the magnetic field is rotated. The other is a CMF mode in which current is applied to switch the magnetic field with a gradient given to the magnetic field.

Figure 26:
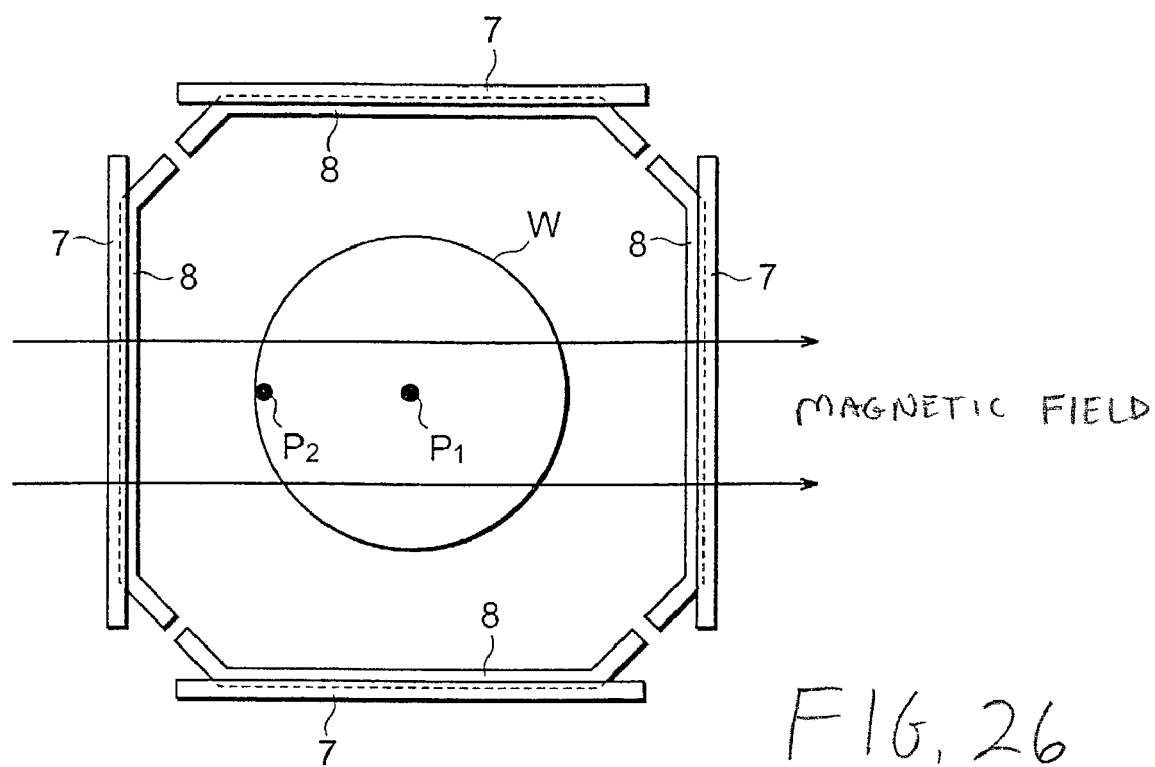
FIG. 26 shows an instantaneous state when sine mode of electric currents are supplied to the main and sub-magnetic coil sections.

FIG. 26 shows the state of the magnetic field direction being sine 0 degree when sine mode currents are applied to the main magnetic coil section 7 and to the sub-magnetic coil section 8. Here, $P_1$ indicates the center of the wafer W, and $P_2$ indicates any edge position of the wafer W.

Figure 27:
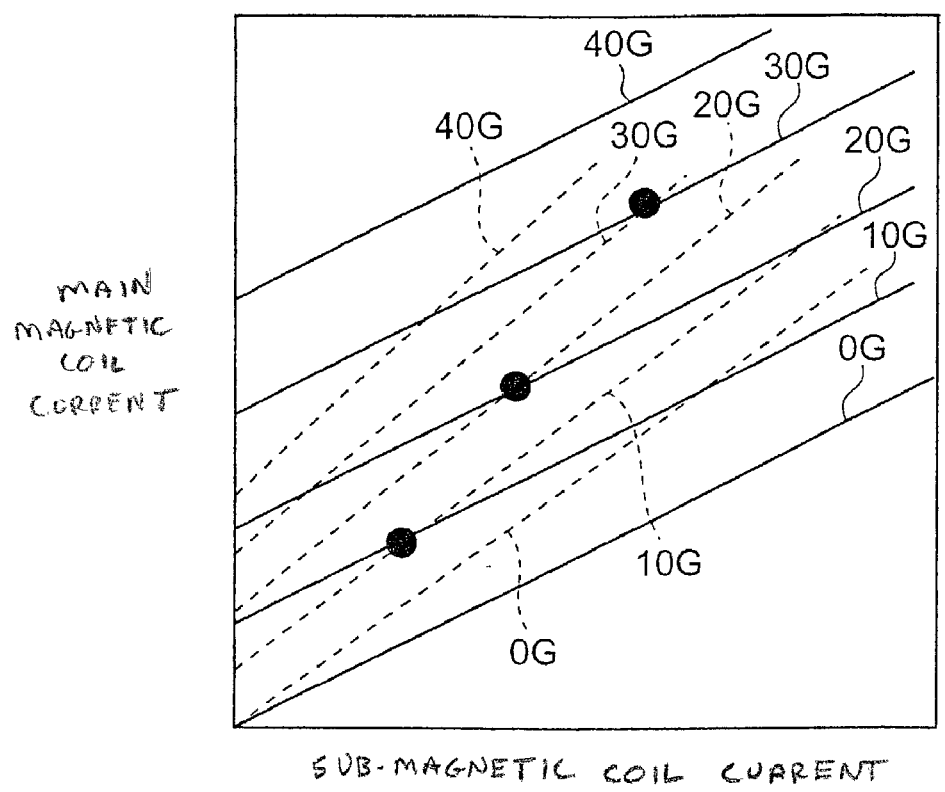
FIG. 27 shows the magnetic field intensity characteristics appearing on the wafer in the state shown in FIG. 26.

FIG. 27 shows the measurements of magnetic field intensity produced on the wafer W in the above setting. In FIG. 27, the horizontal axis represents the current value applied to the sub-magnetic coil section 8 and the vertical axis represents the current value applied to the main magnetic coil section 7. In the figure, the solid lines indicate the magnetic field intensity (0 to 40 G) in the center $P_1$ of the wafer W, and the broken lines indicate the magnetic field intensity (0 to 40 G) in the edge position $P_2$ of the wafer W.

Here, if the currents applied to the main magnetic coil section 7 and to the sub-magnetic coil section 8 are chosen so that the solid lines and the broken lines intersect each other (at the black dots in the figure), the magnetic field intensity at the center $P_1$ and the edge position $P_2$ of the wafer W are equalized.

Figure 28:
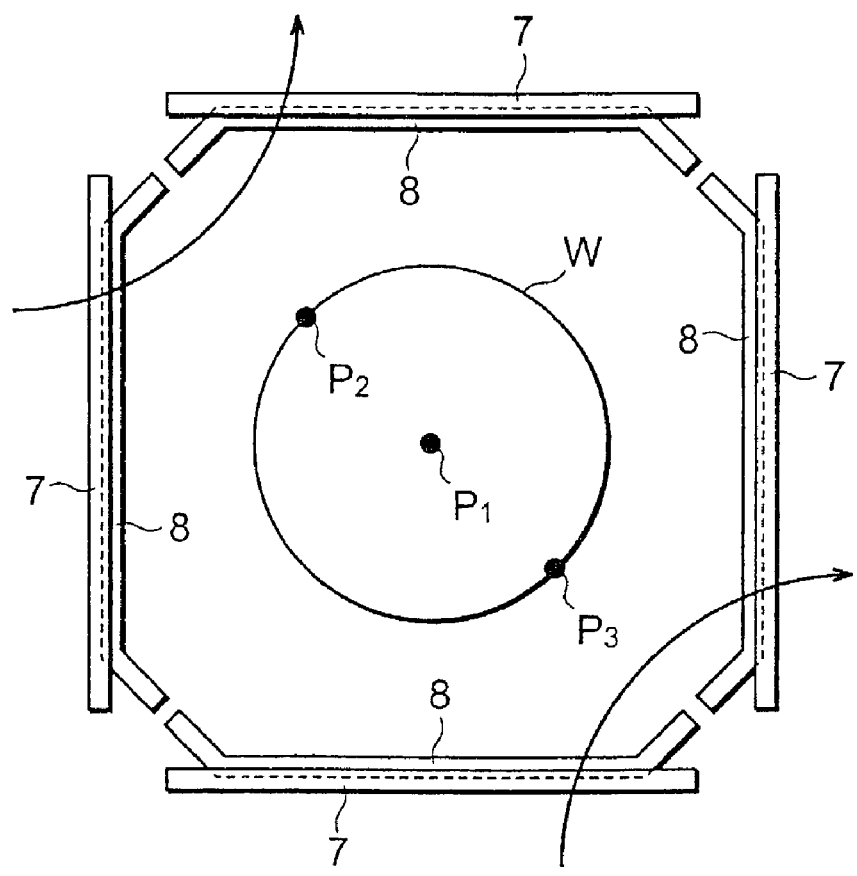
FIG. 28 shows the state when CMF mode of currents are applied to the main and sub-magnetic coil sections.

FIG. 28 shows the state when electric currents in the CMF mode are applied to the main magnetic coil section 7 and to the sub-magnetic coil section 8. In the figure, $P_1$ indicates the center of the wafer W, $P_2$ indicates any edge position of the wafer W, and $P_3$ indicates a position opposite the $P_2$ beyond the center $P_1$ of the wafer W. Incidentally, the CMF compensation values for the main and sub-magnetic coil sections 7 and 8 need not necessarily be made the same as each other.

Figure 29:
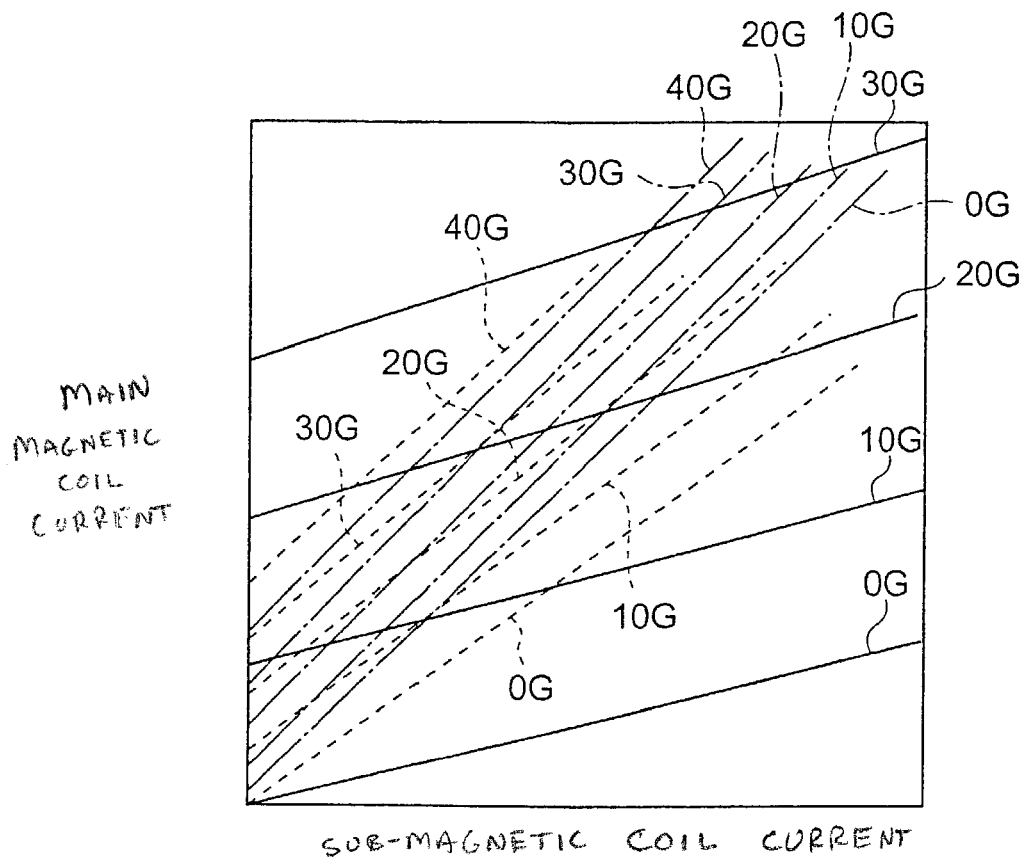
FIG. 29 shows the magnetic field intensity characteristics appearing on the wafer in the state shown in FIG. 28.

FIG. 29 shows the measurements of the magnetic field intensity produced on the wafer W in the above setting. The horizontal and vertical axes of FIG. 29 are the same as those of FIG. 27. In the figure, the solid lines indicate the magnetic field intensity (0 to 30 G) in the center $P_1$ of the wafer W, the broken lines indicate the magnetic field intensity (0 to 40 G) in the edge position $P_2$ of the wafer W, and the dash-and-dotted lines indicate the magnetic field intensity (0 to 40 G) in the edge position $P_3$ of the wafer W. In the CMF mode, it is preferable to choose the currents supplied to the main and sub-magnetic coil sections 7 and 8 so that $$B(P_1)=(B(P_2)+B(P_3))/2$$

where, $B(P_1)$, $B(P_2)$, and $B(P_3)$ are the magnetic field intensity values respectively at positions $P_1$, $P_2$, and $P_3$ on the wafer W.

Figure 30:
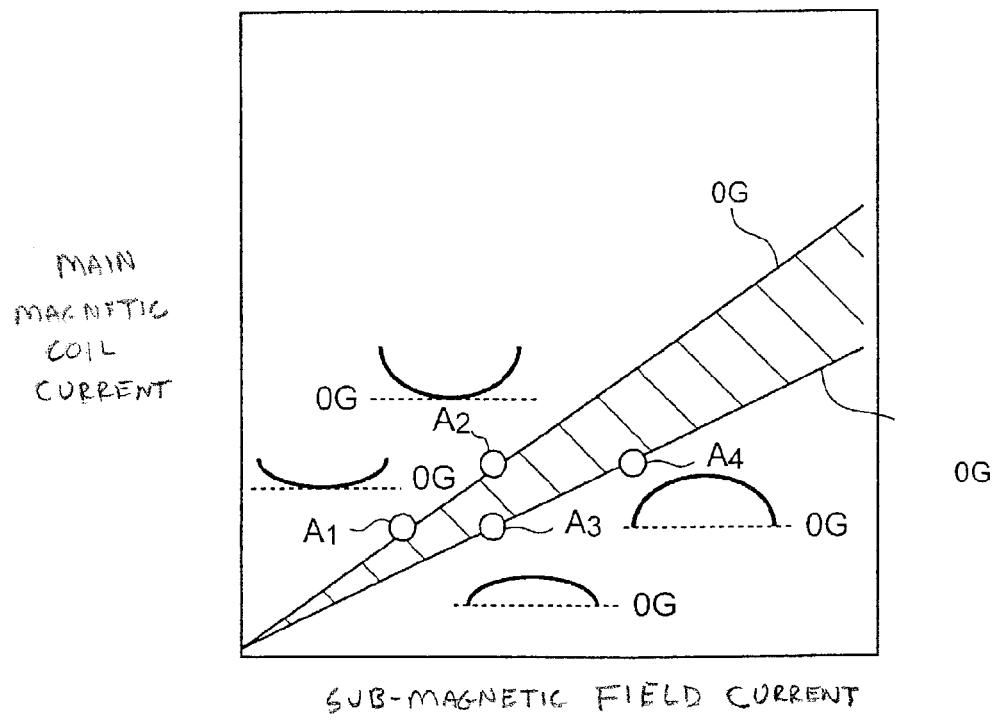
FIG. 30 shows the characteristics when the magnetic field intensity in the center and on the edge of the wafer are 0 G with the magnetic field intensity characteristics shown in FIG. 27.

FIG. 30 shows the characteristics when the magnetic field intensity values at the center $P_1$ and the edge position $P_2$ in FIG. 27 are 0 G. In the figure, when the current supplies to the main and sub-magnetic coil sections 7 and 8 are set as $A_1$ and $A_2$, magnetic field intensity values produced are 0 G in the center of the wafer W and higher than 0 G on the edge of the wafer W. When the current supplies to the main and sub-magnetic coil sections 7 and 8 are set as $A_3$ and $A_4$, magnetic field intensity values produced are 0 G on the edge of the wafer W and higher than 0 G in the center of the wafer W. It is also possible to produce a W-shape magnetic field intensity distribution in which the intensity is 0 G in the center and in the area other than the edge, by choosing the current supplies to the main and sub-magnetic coil sections 7 and 8 within the hatched area in the figure.

Incidentally, the magnetic field intensity distribution does not necessarily agree with the etch rate distribution. Sometimes the etch rate distribution becomes non-uniform due to factors such as the distribution of electric power supplied to the support pedestal 3 and due to the flow rate distribution of the etching gas supplied to the chamber 2. This embodiment of the invention makes it possible to produce versatile magnetic field as described above by supplying electric currents to the main and sub-magnetic coil sections 7 and 8 so that the magnetic field intensity of 0 G is produced. Therefore, it is possible to obtain a uniform etch rate by regulating the magnetic field intensity distribution according to the etch rate distribution. Furthermore, the magnetic field intensity may be adjusted to produce a magnetic field that compensates for plasma anomalies caused by non-uniformities in power distribution, gas injection, backside gas leakage, gas exhaust, and the like. Thus the coil and counter coil combination may be used to compensate for plasma non-uniformities that have causes that are not related to the plasma generation magnetics.

Figure 31:
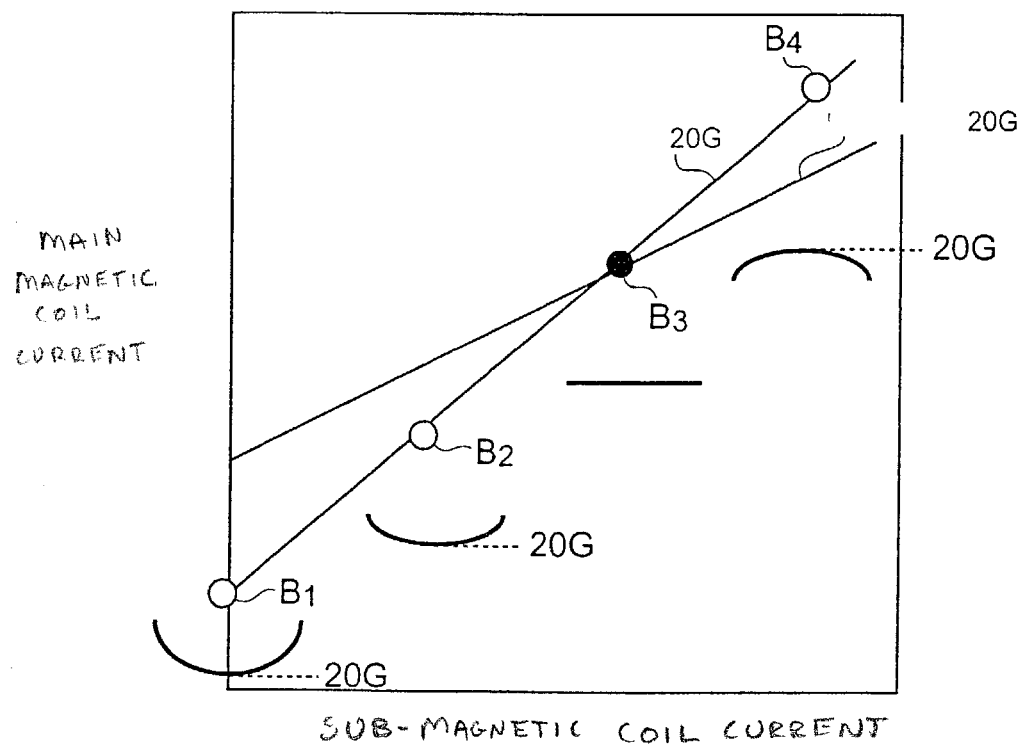
FIG. 31 shows the characteristics when the magnetic field intensity in the center and on the edge of the wafer are 20 G with the magnetic field intensity characteristics shown in FIG. 27.

FIG. 31 shows the characteristics when the magnetic field intensity at the center $P_1$ and the edge position $P_2$ in FIG. 27 is 20 G. In the figure, when the current supply to the main magnetic coil section 7 is set as $B_1$ and no current is supplied to the sub-magnetic coil section 8, the magnetic field intensity distribution becomes such that the intensity is 20 G in the center of the wafer W, and higher than 20 G on the edge. When the current supply to the main and sub-magnetic coil sections 7 and 8 is set as $B_2$, the magnetic intensity in the center of the wafer W remains to be 20 G, and the magnetic intensity is lower than that produced with the current $B_1$. When the current supply to the main and sub-magnetic coil sections 7 and 8 is set as $B_3$, the magnetic intensity is 20 G both in the center and on the edge of the wafer W. When the current supply to the main and sub-magnetic coil sections 7 and 8 is set as $B_4$, the magnetic intensity distribution becomes such that the intensity in the center of the wafer W is 20 G and that on the edge is lower than 20 G.

Supplying currents to the main and sub-magnetic coil sections 7 and 8 so that the magnetic field intensity is 20 G as described above makes it possible not only that the intensity is higher on the edge of the wafer W than in the center, but also that the intensity is higher in the center than on the edge, and also that the intensity is equal in the center and on the edge of the wafer W.

Next will be described several patterns of current as applied to four sets of the main and sub-magnetic coil sections 7 and 8. In a first electric current pattern, currents varying with time as described below are supplied to the main and sub-magnetic coil sections 7 and 8.

TABLE 3

| | Main magnetic coil section | Sub-magnetic coil section |
| --- | --- | --- |
| 1 | sin(at) | CF x (−sin(at)) |
| 2 | cos(at) | CF x (−cos(at)) |
| 3 | (−sin(at)) | CF x sin(at) |
| 4 | (−cos(at)) | CF x cos(at) |

Figure 32:
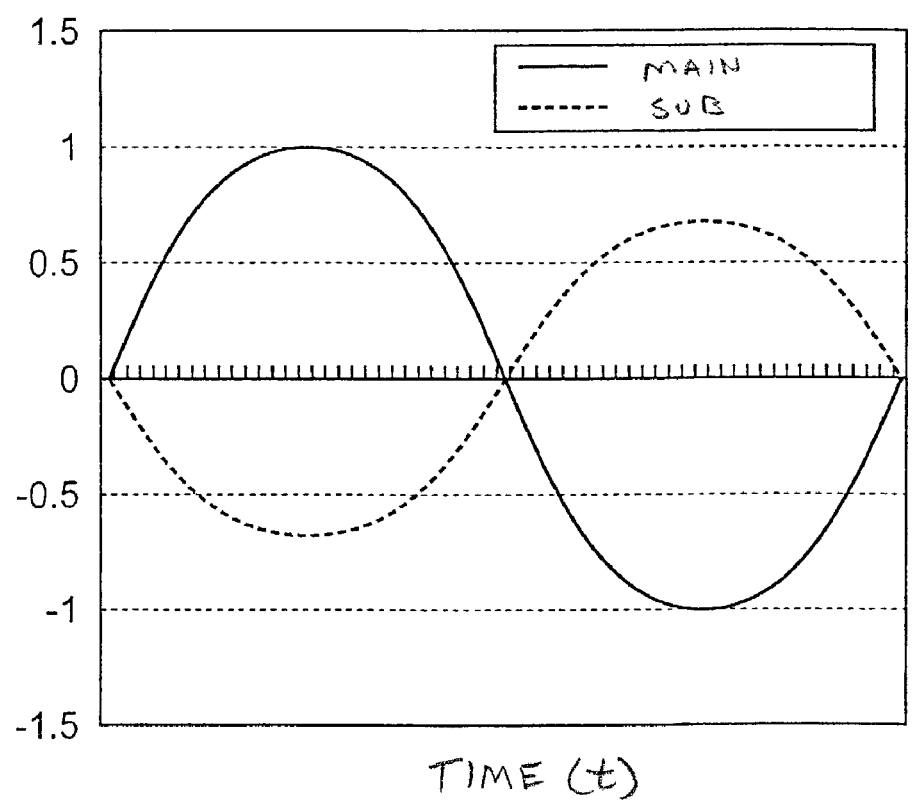
FIG. 32 shows the currents, in the current pattern shown in Table 3, supplied only to one set of the main and sub-magnetic coil sections.
Figure 33:
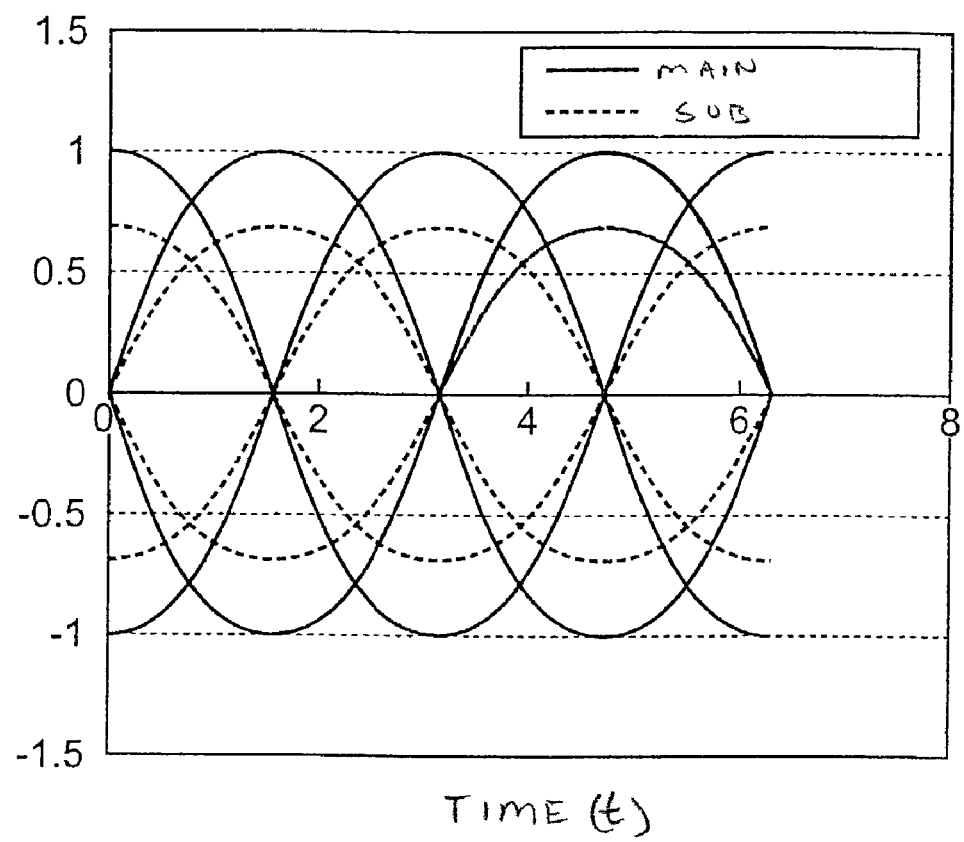
FIG. 33 shows the currents, in the current pattern shown in Table 3, supplied to four sets of the main and sub-magnetic coil sections.

In Table 3, 'a' is a constant, and CF is a correction factor for the sub-magnetic coil section 8 to be adjusted as required relative to the main magnetic coil section 7. In the above pattern, currents supplied only to one set of the main and sub-magnetic coil sections 7 and 8 are shown in FIG. 32, and currents supplied to four sets of the main and sub-magnetic coil sections 7 and 8 are shown in FIG. 33.

Using the above pattern of currents, even when the etch rate is non-uniform between the center and the edge of the wafer W, the etch rate may be equalized by changing the correction factor CF.

In the second pattern, currents varying with time as described below are supplied to the main and sub-magnetic coil sections 7 and 8.

TABLE 4

| | Main magnetic coil section | Sub-magnetic coil section |
| --- | --- | --- |
| 1 | sin(at) | $(CF_1(\cos(2at)^2 + CF_2(\sin(2at)^2))$ x (−sin(at)) |
| 2 | cos(at) | $(CF_1(\cos(2at)^2 + CF_2(\sin(2at)^2))$ x (−cos(at)) |
| 3 | (−sin(at)) | $(CF_1(\cos(2at)^2 + CF_2(\sin(2at)^2))$ x sin(at)) |
| 4 | (−cos(at)) | $(CF_1(\cos(2at)^2 + CF_2(\sin(2at)^2))$ x cos(at)) |

Figure 34:
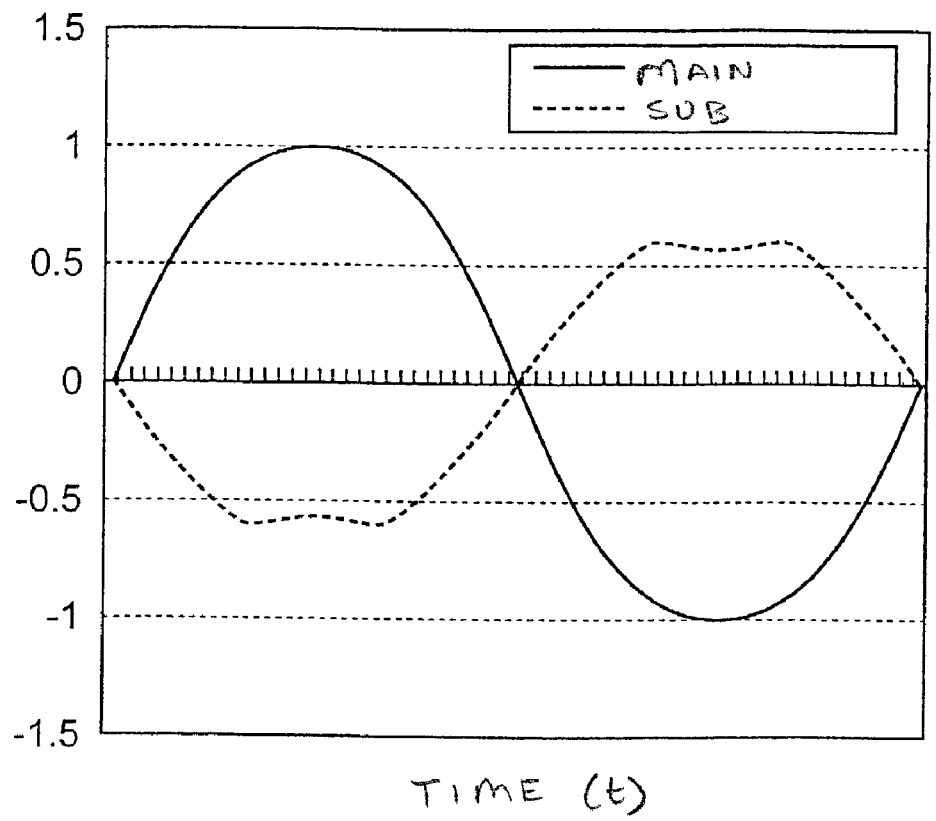
FIG. 34 shows the currents, in the current pattern shown in Table 4, supplied only to one set of the main and sub-magnetic coil sections.

In Table 4, 'a' is a constant, and $CF_1$ and $CF_2$ are correction factors for the sub-magnetic coil section 8 to be adjusted as required relative to the main magnetic coil section 7. $CF_1$ represents correction the factor in the directions of 0, 90, 180, and 270 degrees, and $CF_2$ represents the correction factor in the directions of 45, 135, 225, and 315 degrees. FIG. 34 shows only the current supplied to one set of the main and sub-magnetic coil sections 7 and 8.

Using the above pattern of currents, even when the etching speeds in the directions of 0, 90, 180, and 270 degrees are different from those in the directions of 45, 135, 225, and 315 degrees when any one direction of the wafer W is assumed to be 0 degree, the rate may be adjusted to be equal to each other by changing the correction factors $CF_1$ and $CF_2$.

In the third pattern, currents varying with time as described below are supplied to the main and sub-magnetic coil sections 7 and 8.

TABLE 5

|   | Main magnetic coil section | Sub-magnetic coil section |
|---|---|---|
| 1 | $\sin(at) \times CF_1$ | $CF \times (-\sin(at) \times CF_1$ |
| 2 | $\cos(at) \times CF_2$ | $CF \times (-\cos(at) \times CF_2$ |
| 3 | $(-\sin(at)) \times CF_3$ | $CF \times \sin(at) \times CF_3$ |
| 4 | $(-\cos(at)) \times CF_4$ | $CF \times \cos(at) \times CF_4$ |

Figure 35:
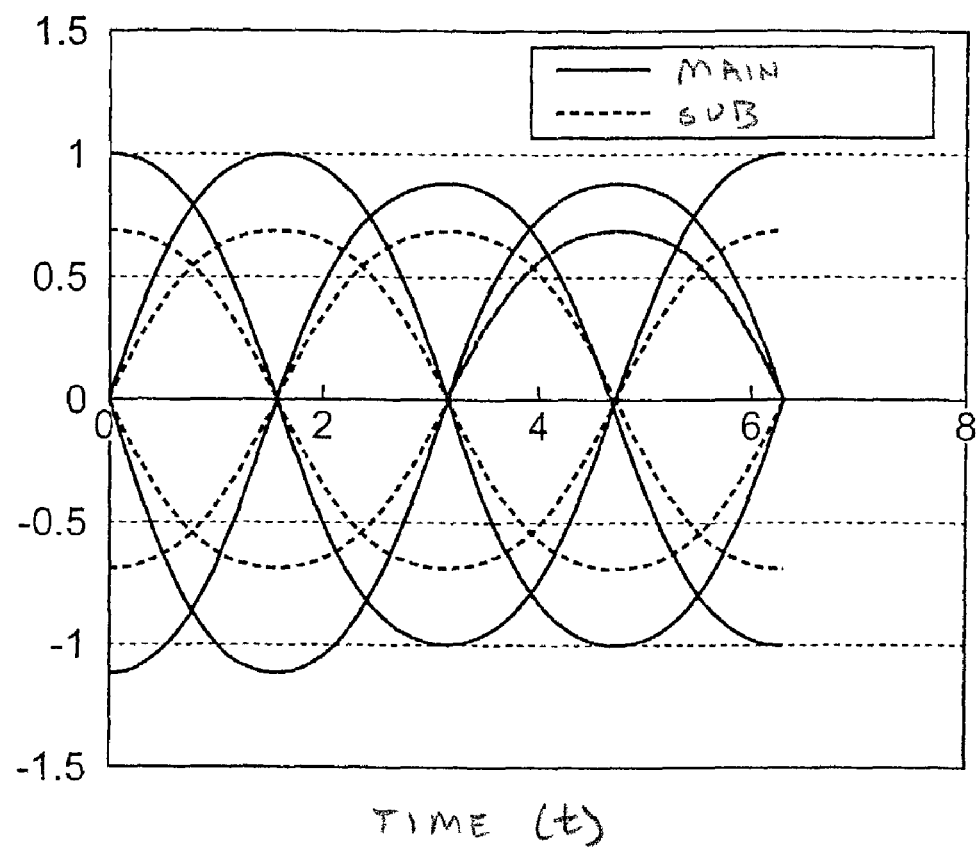
FIG. 35 shows the currents, in the current pattern shown in Table 5, supplied to four sets of the main and sub-magnetic coil sections.

In Table 5, 'a' is a constant, and $CF_1$, $CF_2$, $CF_3$, and $CF_4$ are correction factors. CF is a correction factor for the sub-magnetic coil section 8 relative to the main magnetic coil section 7. The correction factors $CF_1$, $CF_2$, $CF_3$, $CF_4$ and CF are adjusted as required. Currents supplied to the four sets of the main and sub-magnetic coil sections under conditions of $CF_1=CF_2=1$, and $CF_3=CF_4\neq 1$ are shown in FIG. 35.

Using the above pattern of currents, even when the etch rate is nonuniform (asymmetric) in one region relative to other region of the wafer W, the etching speed distribution may be adjusted to be even by changing the correction factors $CF_1$, $CF_2$, $CF_3$, and $CF_4$.

In order to actually adjust the etch rate distribution on the wafer W, the controller 14 immediately extracts the etch rate on the wafer W on the basis of signals detected with the light sensors 13 provided on the reaction chamber 2, and according to the result, chooses an electric current pattern so that the etch rate distribution becomes uniform and also determines the correction factors. Additionally, the respective current supplies 10 and 11 are controlled so that the currents determined as described above are supplied to the main and sub-magnetic coil sections 7 and 8. In this manner, the magnetic field intensity distribution on the wafer W is automatically controlled, so that the etch rate distribution on the wafer W becomes uniform. Incidentally, it may also be arranged that the measurements are performed after etching the wafer W to provide feedback for processing the succeeding wafers.

Figure 36:
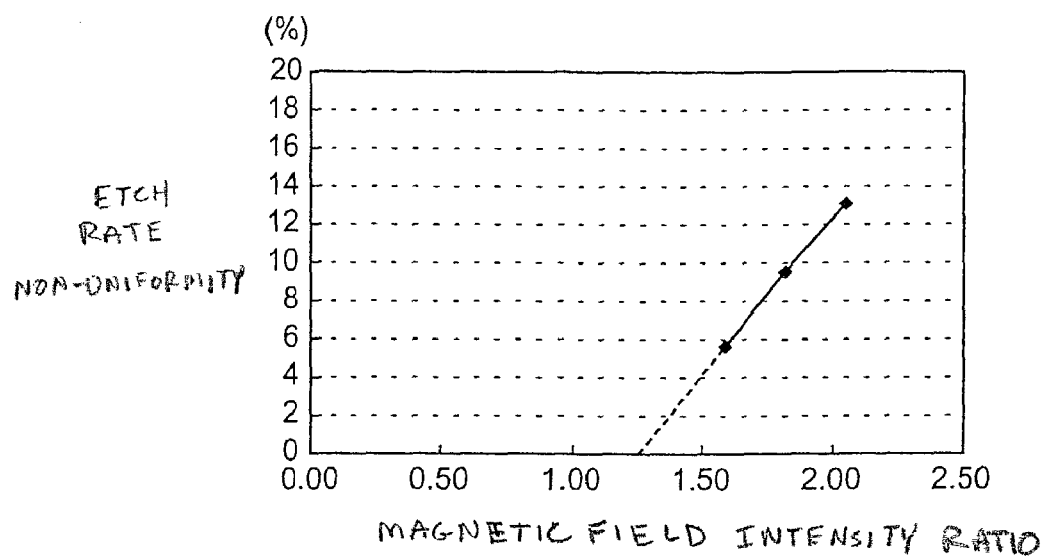
FIG. 36 shows example measurements related to the uniformity of the etch rate on the wafer.

Example measurements of the etch rate distribution on the wafer are shown with black dots in FIG. 36, with the horizontal axis representing the ratio of the magnetic field intensity at the wafer center to that of the wafer edge and the vertical axis representing the non-uniformity of the etch rate distribution, and with currents in the sine mode applied to the four sets of the main and sub-magnetic coil sections. From the results, it is estimated that the non-uniformity of the etch rate distribution becomes about 0% when the ratio of the magnetic field intensity at the wafer center to that at the wafer edge is 1.25.

As described above, the magnetic field generator 6 of this embodiment is provided with the sub-magnetic coil section 8 in addition to the main magnetic coil section 7, and the electric current is applied to the sub-magnetic coil section 8 in a direction opposite of the direction of the electric current applied to the main magnetic coil section 7, so that the direction of the magnetic field produced with the main magnetic coil section 7 is opposite of the direction of the magnetic field produced with the sub-magnetic coil section 8. Since the magnetic fields of opposite directions are superimposed on each other, a magnetic field of a differential intensity between the intensity produced with the main magnetic coil section 7 and the sub-magnetic coil section 8 appears on the wafer W.

Since the sub-magnetic coil section 8 is smaller in size than the main magnetic coil section 7, the gradient of the magnetic field intensity distribution produced with the sub-magnetic coil section 8 is steeper than that produced with the main magnetic coil section 7. Since the sub-magnetic coil section 8 is placed nearer to the wafer W than the main magnetic coil section 7, and since both ends of the sub-magnetic coil section 8 are provided with bent portions 8a, the gradient of the magnetic field intensity distribution produced with the sub-magnetic coil section 8 tends to be further steeper than that produced with the main magnetic coil section 7. Thus, as the magnetic field intensity distribution produced with the main magnetic coil section 7 is offset by the magnetic field intensity distribution produced by the sub-magnetic coil section 8 having such a steep gradient, a magnetic field of a uniform intensity distribution, unlike in an arrangement without the sub-magnetic coil section 8, is provided on the wafer W.

With the magnetic field intensity distribution made uniform as describe above, uniformity of plasma density is improved and charging damage caused by plasma non-uniformity is reduced. As a result, yield and reliability are improved in the manufacture of semiconductor devices with the etch chamber.

Providing the sub-magnetic coil section 8 in addition to the main magnetic coil section 7 enables to produce many types of distribution of the magnetic field intensity, not only uniform distribution but also a distribution with the intensity higher on the edge than in the center of the wafer W, or higher in the center than on the edge of the wafer W. Therefore, it is possible to adjust the magnetic field intensity distribution so as to obtain the best uniformity of process characteristics such as the etch rate and selectivity ratio.

Since the bent portions 8a are provided on both ends of the sub-magnetic coil section 8, the magnetic field produced with the bar component (horizontal component) and the magnetic field produced with the pole component (vertical component) of the sub-magnetic coil section 8 may be balanced with each other.

Moreover, since the magnetic field intensity distribution may be changed by only changing the current applied to the sub-magnetic coil section 8, it is possible to adjust the magnetic field intensity distribution for the best etch rate uniformity, and to adjust the magnetic field intensity distribution so that the charging damage is mitigated. In other words, constituting the magnetic field generator 6 with the magnetic coil sections (electromagnets) 7 and 8, unlike by the use of permanent magnets, widens the applicability of the magnetic field generator 6.

The arrangement of cooling the main and sub-magnetic coil sections 7 and 8 by supplying cooling water or the like to the frame 9 provides the effects as described below. That is, since the magnetic fields produced with the main and sub-magnetic coil sections 7 and 8 offset each other as described above, in case the currents are supplied for example equally to the main and sub-magnetic coil sections 7 and 8, resultant intensity of the magnetic field decreases. Therefore, in order to produce the intended magnetic field intensity, current amounts supplied to the main and sub-magnetic coil sections 7 and 8 must be increased, which results in the increase in the heat generated and electric power consumed. However, cooling the main and sub-magnetic coil sections 7 and 8 restrains the heat generation, and improves durability of the main and sub-magnetic coil sections 7 and 8.

Figure 37:
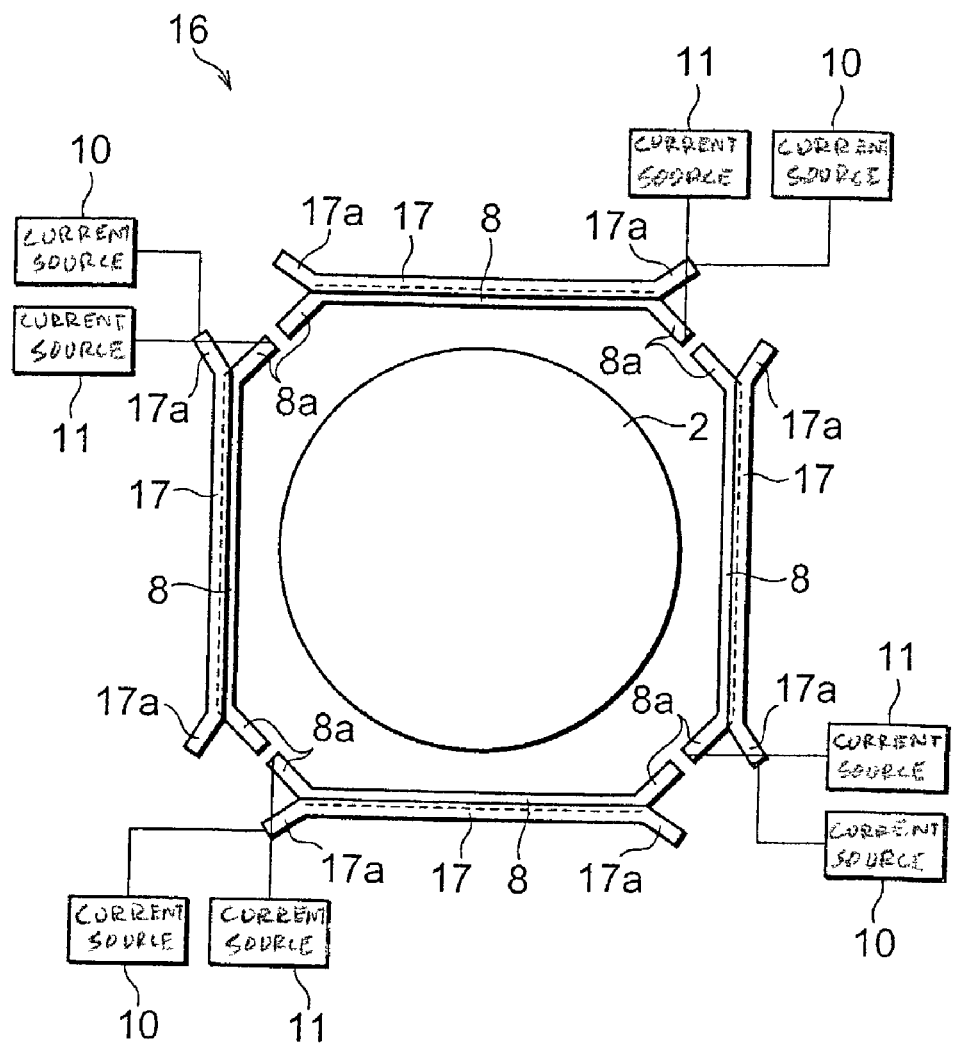
FIG. 37 shows a magnetic field generator as another embodiment of the invention.

Another embodiment of the invention will be described in reference to FIG. 37. In the figure, the same reference numerals are provided to the same components or counterparts of those described in the above embodiment, the description of which will be omitted.

In reference to the figure, a magnetic field generator 16 of this embodiment comprises four main magnetic coil sections 17 placed around the reaction chamber 2 to produce a magnetic field nearly parallel to the top surface of the support pedestal 3, and four sub-magnetic coil sections 8 placed nearly coaxially with the respective main magnetic coil sections 17 to produce a magnetic field of opposite direction to that of the magnetic field produced with the main magnetic coil sections 17. Both ends of each main magnetic coil section 17 are provided with bent portions 17a bent in the directions opposite of the reaction chamber 2.

As the bent portions 17a are provided on both ends of the main magnetic coil section 17 as described above, the difference between the distance from the support pedestal 3 to both ends of the main magnetic coil section 17 and the distance from the support pedestal 3 to both ends of the sub-magnetic coil section 8 increases. As a result, the gradient of the magnetic field intensity distribution produced with the sub-magnetic coil section 8 becomes steeper than that with the main magnetic coil sections 17. Therefore, the magnetic field intensity distribution produced with the sub-magnetic coil section 8 further offsets the magnetic field intensity distribution produced with the main magnetic coil section 17, so that a magnetic field having a uniform intensity distribution is produced on the wafer W.

The present invention is not limited to the above embodiments. For example, while the above embodiments are constituted that the sub-magnetic coil section is made smaller in size than the main magnetic coil section and that the sub-magnetic coil section is placed nearer to the support pedestal 3 than the main magnetic coil section, the invention is not limited to such a constitution. Concretely, it may be constituted only that the sub-magnetic coil section is made smaller in size than the main magnetic coil section, or only that the sub-magnetic coil section is placed nearer to the support pedestal 3 than the main magnetic coil section.

Moreover, with the above embodiments, it is assumed that electric currents are supplied to the main and sub-magnetic coil sections individually from the current supplies 10 and 11. However, it may also be constituted that a common current supply is used to supply the same current to both of the coil sections and that the ratio of the number of coil turns of the main magnetic coil section to the number of coil turns of the sub-magnetic coil section is variable. In that case, a single current supply suffices for a set of main and sub-magnetic coil sections and is advantageous in cost. In another constitution for example, the ratio of the current value supplied to the main magnetic coil section to the current value supplied to the sub-magnetic coil section and the ratio of the number of coil turns of the main magnetic coil section to that of the sub-magnetic coil section are fixed so that the most uniform magnetic field intensity distribution is provided.

While the above embodiment is also constituted that the main and sub-magnetic coil sections are placed outside the reaction chamber 2, they may be placed if possible within the reaction chamber 2.

While the above embodiment is also constituted that the main and sub-magnetic coil sections are constituted separately, those sections may be made in a single section. In that case, assembly and maintenance of the magnetic field generator are facilitated.

Furthermore, while the semiconductor wafer processing chamber is a dry etching chamber in the above embodiments, it is a matter of course that the present invention is applicable to other types of semiconductor wafer processing chambers such as a CVD chamber in which the plasma formation is accelerated by the use of electromagnets.

While foregoing is directed to the preferred embodiment of the present invention, other and further embodiments of the invention may be devised without departing from the basic scope thereof, and the scope thereof is determined by the claims that follow.

The invention claimed is:

1. A magnetic field generator in a semiconductor substrate processing system comprising:
   a plurality of main magnetic coil sections for forming a magnetic field generally parallel to a top surface of a substrate supporting member, wherein each of the plurality of main magnetic coil sections is oriented substantially perpendicular with respect to the top surface of the substrate supporting member; and
   a plurality of sub-magnetic coil sections, where each one of the sub-magnetic coil sections is associated with and placed generally coaxially with each one of said main magnetic coil sections, each one of the sub-magnetic coil sections forms a magnetic field opposite in direction to said magnetic field formed by an associated main magnetic coil section.

2. A magnetic field generator of claim 1, wherein the dimensions of said sub-magnetic coil sections are smaller than the dimensions of said main magnetic coil sections.

3. A magnetic field generator of claim 1, wherein said sub-magnetic coil sections are placed nearer to said supporting member than said main magnetic coil sections.

4. A magnetic field generator of claim 1, wherein said main and sub-magnetic coil sections are placed around a reaction chamber, and said sub-magnetic coil sections are smaller in height dimension than said main magnetic coil sections.

5. A magnetic field generator of claim 1, wherein said main and sub-magnetic coil sections are placed around a reaction chamber and both ends of said sub-magnetic coil sections are provided with bent portions bent toward said reaction chamber.

6. A magnetic field generator of claim 1 wherein said main and sub-magnetic coil sections are placed around a reaction chamber and both ends of said main magnetic coil sections are provided with bent portions bent in the direction opposite said reaction chamber.

7. A magnetic field generator of claim 1, further comprising a first current supply for supplying electric currents to said main magnetic coil sections and with a second current supply for supplying electric currents to said sub-magnetic coil sections.

8. A magnetic field generator of claim 1 further comprising a cooling means for cooling said main and sub-magnetic coil sections.

9. A magnetic field generator of claim 8, wherein said main and sub-magnetic coil sections are provided on frame members, and
said cooling means is provided on said frame members and provided with cooling passages for a coolant to flow through.

10. A magnetic field generator of claim 1, wherein said main and sub-magnetic coil sections are provided in four sets.

11. A semiconductor substrate processing system comprising:
a supporting member for supporting a substrate and placed in a reaction chamber,
a plasma forming means for forming plasma in said reaction chamber, and
a magnetic field generating means for generating magnetic field in said reaction chamber to accelerate said plasma formation with said plasma forming means, wherein said magnetic field generating means comprises:
a plurality of main magnetic coil sections for forming a magnetic field generally parallel to a top surface of a substrate supporting member, wherein each of the plurality of main magnetic coil sections is oriented substantially perpendicular with respect to the top surface of the substrate supporting member; and
a plurality of sub-magnetic coil sections, wherein each one of the sub-magnetic coil sections is associated with and placed generally coaxially with each one of said main magnetic coil sections, each one of the sub-magnetic coil sections forms a magnetic field opposite in direction to said magnetic field formed by an associated main magnetic coil section.

* * * * *